(12) United States Patent
Wieland et al.

(10) Patent No.: US 8,242,470 B2
(45) Date of Patent: Aug. 14, 2012

(54) OPTICAL SWITCHING IN A LITHOGRAPHY SYSTEM

(75) Inventors: Marco Jan-Jaco Wieland, Delft (NL); Johannes Christiaan van 't Spijker, Delft (NL); Remco Jager, Delft (NL); Pieter Kruit, Delft (NL)

(73) Assignee: Mapper Lithography IP B.V., CJ Delft (NL)

( * ) Notice: Subject to any disclaimer, the term of this patent is extended or adjusted under 35 U.S.C. 154(b) by 927 days.

(21) Appl. No.: 11/653,107

(22) Filed: Jan. 11, 2007

(65) Prior Publication Data
US 2007/0187625 A1 Aug. 16, 2007

Related U.S. Application Data

(62) Division of application No. 10/692,632, filed on Oct. 24, 2003, now Pat. No. 6,958,804.

(60) Provisional application No. 60/421,464, filed on Oct. 25, 2002.

(51) Int. Cl.
*G21K 5/10* (2006.01)
*G03B 27/42* (2006.01)
*G03B 27/54* (2006.01)

(52) U.S. Cl. ... 250/492.22; 355/53; 355/67; 250/492.21

(58) Field of Classification Search ............... 355/53; 250/311, 398, 492.2, 492.22, 492.23, 492.3
See application file for complete search history.

(56) References Cited

U.S. PATENT DOCUMENTS

| | | | |
|---|---|---|---|
| 4,730,198 A * | 3/1988 | Brown et al. | 385/89 |
| 4,900,126 A * | 2/1990 | Jackson et al. | 385/114 |
| 5,149,976 A | 9/1992 | Sipma | |
| 5,640,227 A | 6/1997 | Kato et al. | |
| 5,691,541 A | 11/1997 | Ceglio et al. | |
| 6,014,200 A | 1/2000 | Sogard et al. | |
| 6,166,369 A * | 12/2000 | Assadi et al. | 250/214.1 |
| 6,251,550 B1 | 6/2001 | Ishikawa | |
| 6,312,134 B1 | 11/2001 | Jain et al. | |
| 6,379,867 B1 | 4/2002 | Mei et al. | |
| 6,513,993 B1 * | 2/2003 | Nakanishi et al. | 385/92 |
| 6,515,409 B2 | 2/2003 | Muraki et al. | |
| 6,667,486 B2 | 12/2003 | Ohta et al. | |
| 6,724,002 B2 | 4/2004 | Mankos et al. | |

(Continued)

FOREIGN PATENT DOCUMENTS
WO    WO 91/10170    7/1991

(Continued)

*Primary Examiner* — Hung Henry Nguyen
*Assistant Examiner* — Steven H Whitesell Gordon
(74) *Attorney, Agent, or Firm* — Blakely, Sokoloff, Taylor & Zafman

(57) ABSTRACT

A maskless lithography system for transferring a pattern onto the surface of a target. At least one beam generator for generating a plurality of beamlets. A plurality of modulators modulate the magnitude of a beamlet, and a control unit controls of the modulators. The control unit generates and delivers pattern data to the modulators for controlling the magnitude of each individual beamlet. The control unit includes at least one data storage for storing the pattern data, at least one readout unit for reading out the data from the data storage, at least one data converter for converting the data that is read out from the data storage into at least one modulated light beam, and at least one optical transmitter for transmitting the at least one modulated light beam to the modulation modulators.

56 Claims, 15 Drawing Sheets

U.S. PATENT DOCUMENTS

Figure 2C:
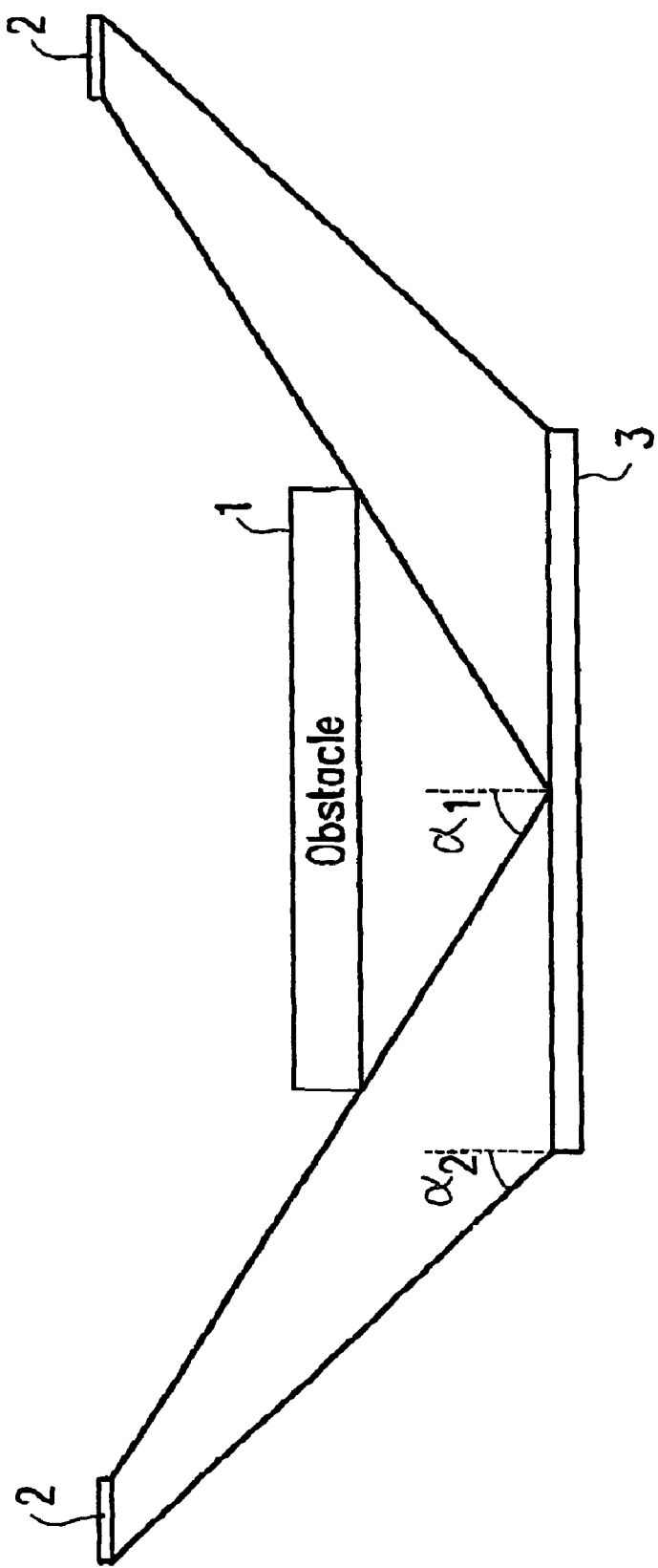

| | | |
|---|---|---|
| 6,828,574 B1 | 12/2004 | Allen |
| 7,612,866 B2 | 11/2009 | Wieland et al. |
| 2001/0004185 A1 | 6/2001 | Muraki et al. |
| 2001/0028043 A1 | 10/2001 | Hamaguchi et al. |
| 2002/0145113 A1 | 10/2002 | Sullivan et al. |
| 2003/0160248 A1* | 8/2003 | Yamaguchi et al. ............ 257/79 |
| 2003/0202750 A1* | 10/2003 | Okada et al. .................... 385/49 |
| 2004/0104353 A1 | 6/2004 | Berglund |
| 2004/0124372 A1 | 7/2004 | Gil et al. |

FOREIGN PATENT DOCUMENTS

| | | |
|---|---|---|
| WO | WO 00/60632 | 10/2000 |
| WO | WO 01/35165 | 5/2001 |

* cited by examiner

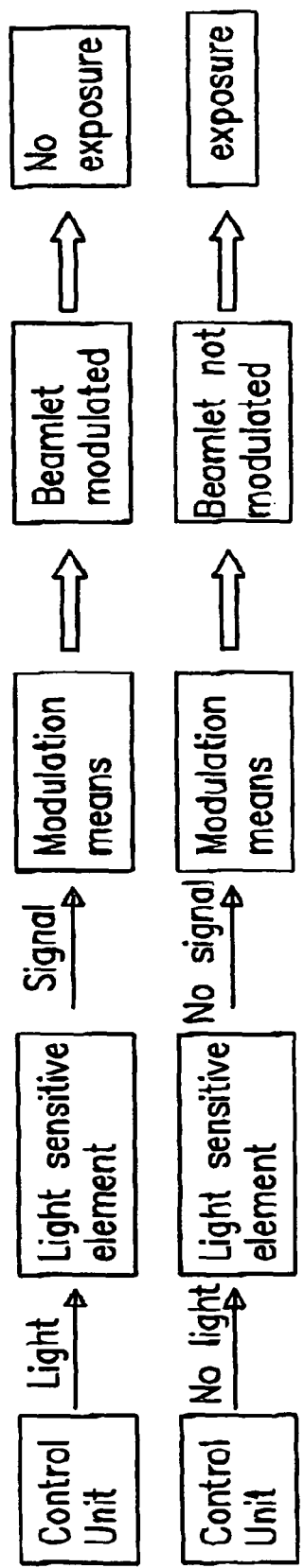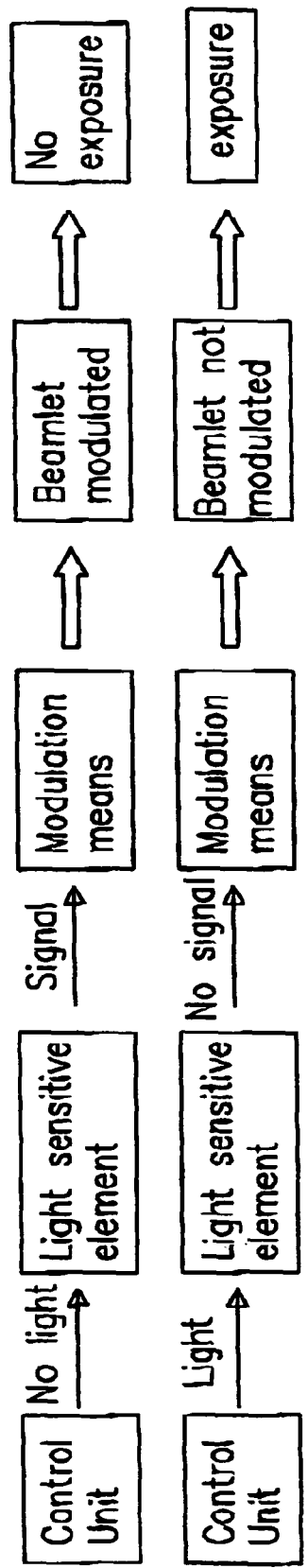
FIG. 1A
FIG. 1B

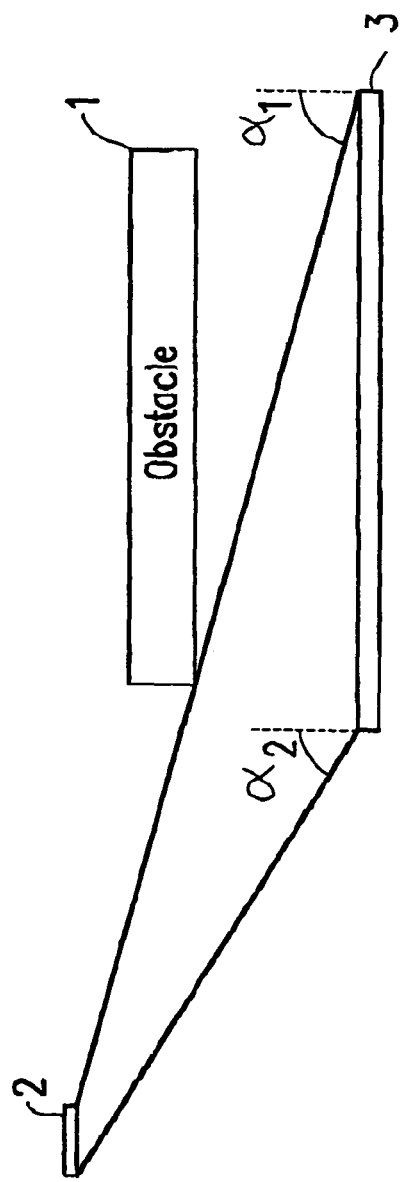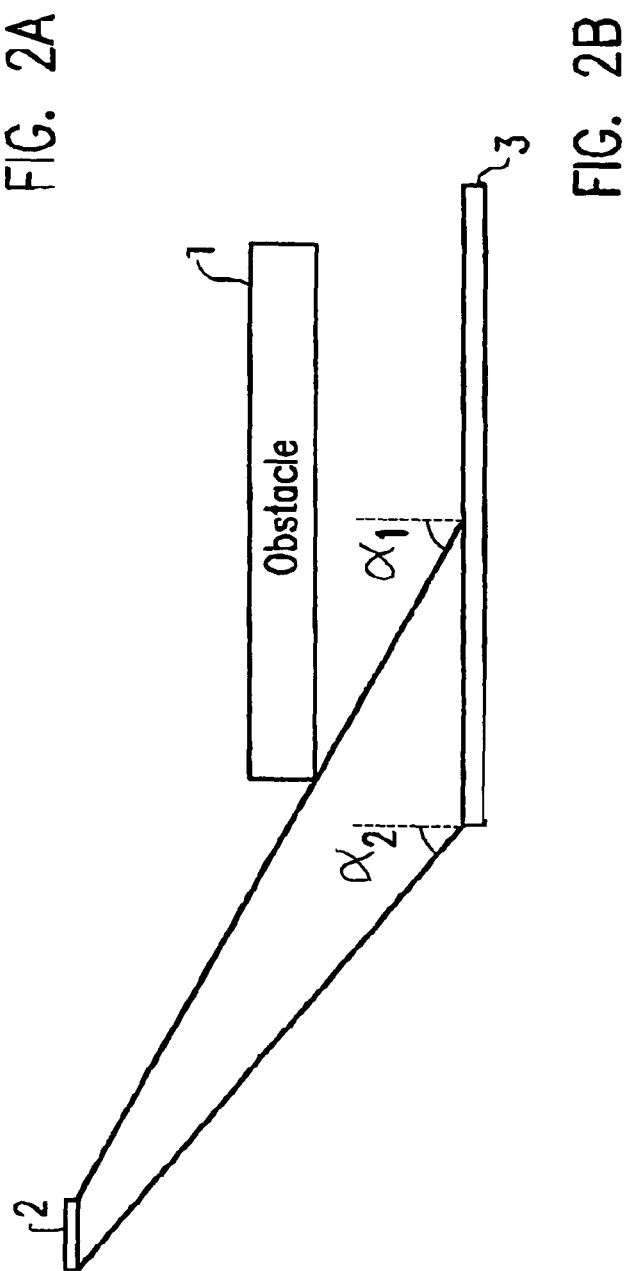

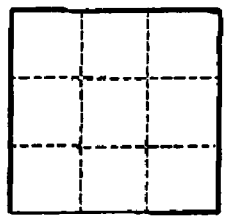
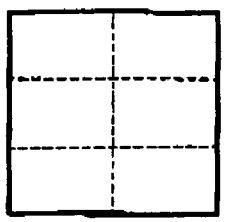
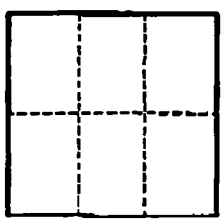
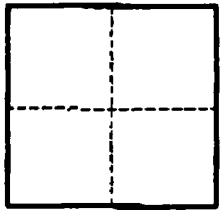
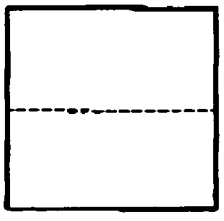
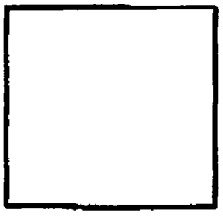
FIG. 3A
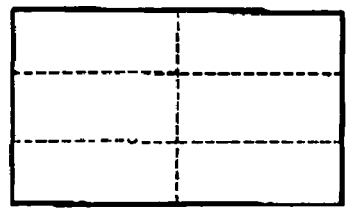
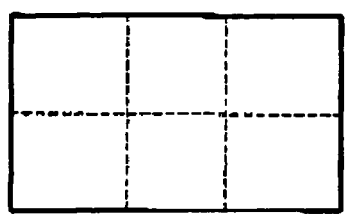
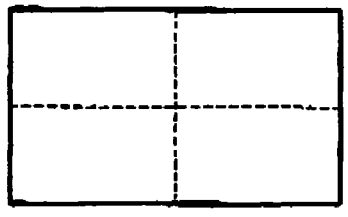
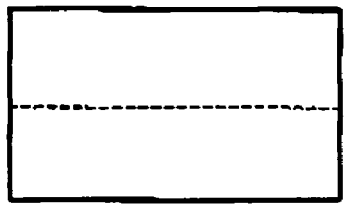
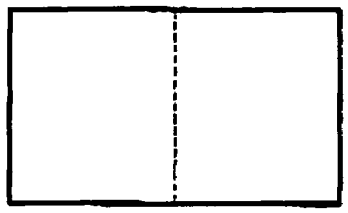
FIG. 3B

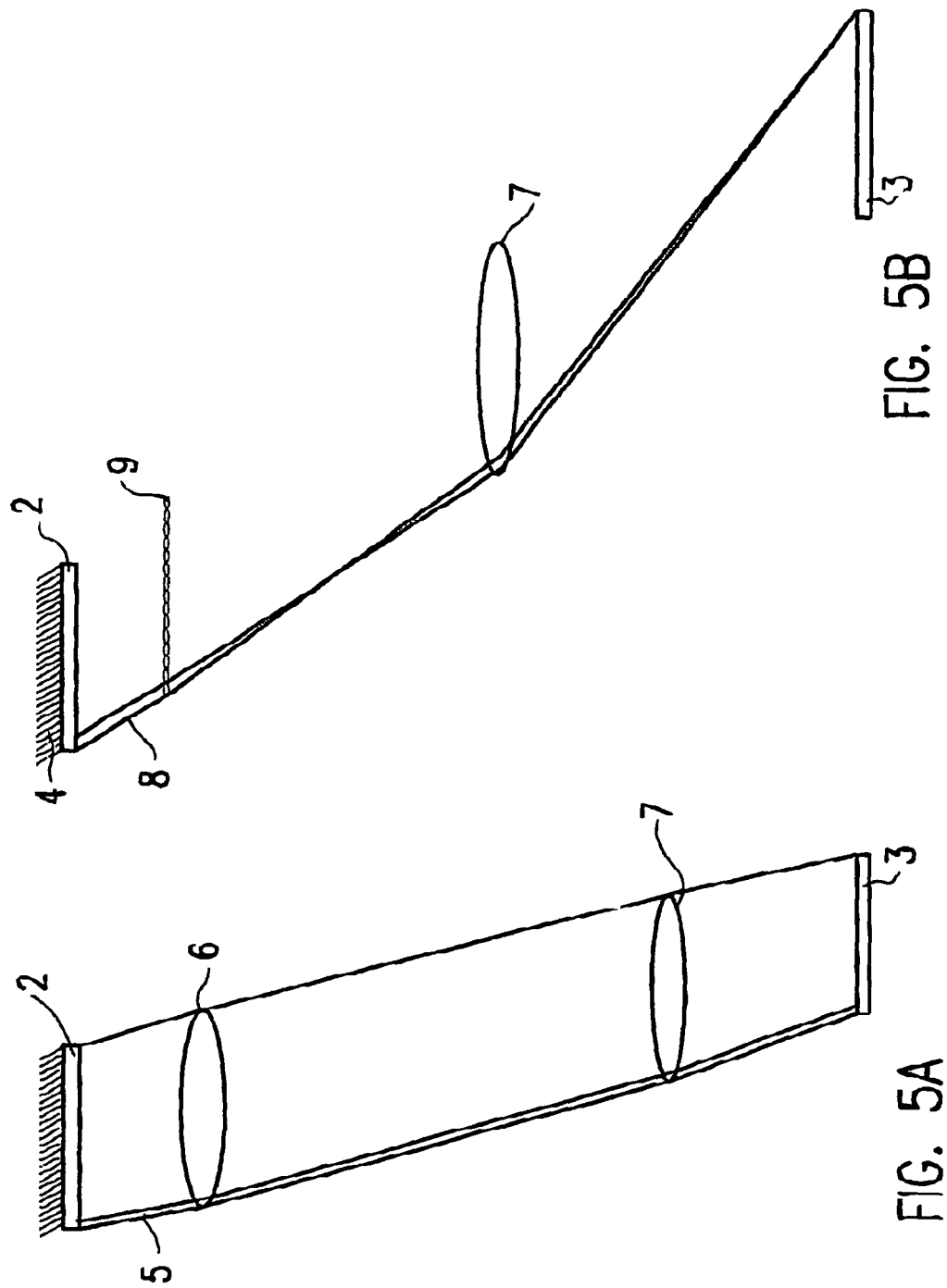

OPTICAL SWITCHING IN A LITHOGRAPHY SYSTEM

The present application is a divisional of non-provisional U.S. patent application Ser. No. 10/692,632 filed Oct. 24, 2003, now U.S. Pat. No. 6,958,804 issued Oct. 25, 2005, which claims priority from U.S. Provisional application No. 60/421,464 filed Oct. 25, 2002.

BACKGROUND

Lithography systems, including ion, laser, EUV and electron beam systems, all require means to process and deliver a pattern to some kind of writing means. A well known way to accomplish this is by using a mask, and projecting this mask onto a substrate. As the resolution becomes smaller and smaller, these masks have become more difficult to produce. Furthermore, the (optical) means for projecting these masks have become very complex.

A way of to overcome this problem is by using maskless lithography.

Maskless lithography systems can be divided in two classes. In the first class the pattern data are sent towards the individual radiation source or sources. By tuning the intensity of the sources at the right times, a pattern can be generated on the substrate, which is most often a wafer or a mask. The switching of sources may get problematic when the switching speed increases, for instance due to a settling time or a source, which can be too long.

The second class of maskless lithography systems on the other hand comprises either continuous sources or sources operating at constant frequency. The pattern data are now sent towards modulation means, which completely or partly stop the emitted beams from reaching the target exposure surface when necessary. By controlling these modulation means while moving over the target exposure surface, a pattern is written. The modulation means are less critical for settling times. A lot of maskless lithography systems designed to achieve a higher throughput are therefore using modulation means.

In U.S. Pat. Nos. 5,834,783, 5,905,267 and 5,981,954, for instance, a maskless electron beam lithography system with one electron source is disclosed. The emitted electron beam is expanded, collimated and additionally split by an aperture array into a plurality of beamlets. A blanker array fed with pattern data stops the individual beamlets when a control signal is given. The obtained image is then reduced by a reduction electron optical system and projected on a wafer.

In US-A-1-20010028042, US-A-1-20010028043, US-A-1-20010028044, WO-A1-02/054465, WO-A1-02/058118 and WO-A1-02/058119, a maskless electron beam lithography system using a plurality of electron sources is disclosed. The emitted electron beamlets pass a blanker array, which deflects the individual electron beamlets when the appropriate control signal is given. The electron beams are shaped by a shaping array, and focused on a wafer.

In WO-01/18606 and U.S. Pat. No. 6,285,488 an optical lithography system is disclosed which uses a spatial light modulator (SLM) to modulate a light beam. A light source emits light pulses directed towards the SLM. The SLM comprises an array of deformable mirrors, which reflect the emitted beam towards a substrate or towards a beam stop structure depending on a control signal sent to the mirror involved.

The current invention is based on the following insight and understanding of the fundamentals of lithography.

A mask is a highly efficient way to store a pattern, the amount of raw data to describe a pattern is enormous. Moreover, for a commercially acceptable throughput, the data must be transported towards the writing means at a very high data rate. Additionally the high data rate must be obtained within limited space. It was up to now not recognized that improvement of the data path in maskless lithography systems has a profound effect on the through-put of these Systems.

The information on a mask is normally used to transfer a pattern from the mask on a certain area on the target exposure surface. This area is called a die. To get an idea of the amount of data that has to be transferred, imagine a die of 32 mm by 26 mm.

Now consider that somebody wants to write a pattern with a critical dimension (CD) of 45 nm. Then there are $4.1*10^{11}$ CD-elements on a die. If each CD element consists of at least 30*30 pixels to satisfy the requirements, and if there is only one bit needed to represent the intensity of said pixel, the information present on a mask is represented by about $3.7*10^{14}$ bits. Say a commercially acceptable throughput for a maskless lithography system is about 10 wafers/hr. If there are 60 dies on a wafer, 60 times $3.7*10^{14}$ bits have to be transported towards the modulation means per wafer. So 600 times $3.7*10^{14}$ bits have to be transported towards the modulation means in 3600 seconds to get the desired throughput. This corresponds to a data transfer rate of about 60 Tbit/s!

In all mentioned systems the control signals are sent electronically towards the modulation means. However, the bandwidth of a metal wire is limited. The limit on the bandwidth of an electrical interconnect is related to the maximum total capacity of an electrical interconnect $B_{max}$, to the overall cross-section A and the length of the electrical interconnect L in the following way:

$$B_{max}=B_0*(A/L^2)$$

The constant of proportionality $B_0$ is related to the resistivity of copper interconnects. For typical multichip module (MCM) technologies $B_0$ is about $10^{16}$ bit/s. For on-chip lines its value is about $10^{16}$ bit/s. The values are almost independent on the particular fabrication technology.

The limit on the bandwidth of the electrical interconnect is furthermore independent of its configuration. Whether the interconnect is made up of many slow wires or a few fast wires up to the point where other effect start to limit the performance makes no difference.

The desired total capacity of the electrical interconnect is $100*10^{12}=10^{14}$ bit/s. This corresponds to a ratio of the overall cross-section to the square of the length of the electrical interconnect or $10^{-1}$ in the case of a MCM and $10^{-2}$ in the case of an on-chip connection. So if L is 1 m., the overall cross-section of the copper that is needed is 0.01-0.1 $m^2$! Compare that number with the size of a die that is written, which is 0.0008 $m^2$, and it is evidently impossible to establish the data transfer without a demagnification of at least 10 after the pattern information is added to the light beam.

Another approach to visualize the problem is to use the typical speed of an electrical interconnect, which is in the order of 1 Gbit/s. So to transfer 100 Tbit/s, 100,000 copper wires are needed! This takes an enormous amount of space and is difficult to handle.

SUMMARY OF THE INVENTION

An objective of the current invention is to improve the systems described above.

A further objective of the current invention is to increase the throughput of a maskless lithography system.

A further objective or the current invention is to reduce the sensitivity of the lithography system with respect to all kinds of (electromagnetic) disturbances.

A further objective of the current invention is to reduce the space needed for transferring pattern data into the lithography system.

A further objective of the current invention is to increase design flexibility of the system.

The invention therefore provides a maskless lithography system for transferring a pattern onto a surface of a target, comprising:

at least one beam generator for generating a plurality of beamlets;

a modulation means comprising a plurality of modulators for modulating the magnitude of a beamlet and a control unit for controlling each modulator, wherein the control unit generates and delivers pattern data to said modulation means for controlling the magnitude of each individual beamlet, the control unit comprising:

at least one data storage for storing the pattern data;

at least one readout unit to read out the pattern data from the data storage;

at least one data converter for converting the pattern data read out from the data storage into at least one modulated light beam;

at least one optical transmitter for transmitting said at least one modulated light beam to said modulation means.

Using optical data transportation in a lithography system makes it possible to create a maskless lithography system based on known technology, but having an increased thoughput. Furthermore, it is possible to reduce the area needed. Furthermore, optical transmission offers additional freedom for designing the layout of the lithography system.

The radiation source that can be used in the beam generator can emit any kind of radiation like electrons, positrons, x-rays, photons or ions. The source is either a continuous source or a source that is pulsed with a continuous frequency. The source therefore does not generate any information. However, the purpose of a lithography system is to pattern a certain target exposure surface. Since the source does not provide any pattern data or pattern information, the pattern information has to be added to the beamlets somewhere along their trajectory by modulation means. It should in this invention be realized that the pattern information is transported using an optical system. The pattern information is used to control modulation means which modulates beamlets which actually write the pattern into a resist or in another way transfer the pattern onto a sample, for instance a semiconductor wafer. In the system, the nature or the pattern writing beamlets depends on the nature of the source. In fact, the modulated light beam is a pattern information carrying light beam, and the beamlets are pattern writing beamlets.

In an embodiment, the beam generator has only one source, and the lithography system has only one beam generator. In this way, it is easier to control the inter beamlet homogeneity of the system.

The modulation means can operate in different ways and be based on various physical principles, depending on the nature of the beamlets used for writing the pattern. It may generate a signal which results in the activation of some blocking mechanism which stops the beamlet, for instance a mechanical shutter or a crystal becoming opaque due to electro-acoustic stimulation. Another possibility is that to have the modulation means selectively generate a signal, which results in the activation of some sort of deflector element, like an electrostatic deflector or a mirror. This results in a deflection of the selected irradiated beamlet. The deflected beam is then projected on a blanker element, for instance a beam absorbing plate provided with apertures, aligned with the deflectors of mirrors. In both cases a commercially satisfactory throughput can only be acquired when the beamlet modulation is done very fast, preferably with a frequency of 100 MHz or more.

In maskless lithography systems the pattern information or pattern data is represented by computer data, generally digital computer data. The pattern data is partially or completely stored in the data storage of the control unit. The control unit therefore comprises a data storage medium, e.g. RAM, hard disks or optical disk. This data is stored in a format that can be used to control the modulation means in such a way that a predetermined pattern can be repetitively generated. Furthermore, the control unit comprises means to read out the data at a high data rate, To establish the high data rate the control unit comprises an element that converts the data into at least one pattern data carrying light beam. In an embodiment, this data converter a vertical cavity surface emitting laser (VCSEL) diode. If a bit is one, a light signal is emitted while no light is sent out if the value of the bit equals zero. By reading out a sequence of bits, a pattern information carrying light beam is created. The pattern information carrying light beams are then transported towards the modulation means. There are several possible carriers that can realize the data transfer. In an embodiment, parallel data storage means are used which are read out almost simultaneously in order to obtain the data rate required.

In an embodiment the transfer from the converter element in the control unit a region close to the modulation means achieved using optical fibers for the data transport. This allows flexible data transport with minimal disturbance by electromagnetic fields and other means. Furthermore, at allows the control unit to be located remote from the rest of the lithography system, for instance between 2-200 meters away from the rest of the system.

Currently, optical fibers that are used in telecom and Ethernet applications are optimized for specific wavelengths, predominantly 850, 1300 and 1500 nm. The 850 nm optimization is established due to the good availability of the standard InGaAs/GaAs laser diodes. The infrared wavelengths are used because of the low fiber transmission losses, typically smaller than 0.4 dB/km. Future developments aim for wavelengths of 660 and 780 nm. The lower wavelengths are preferred for the present invention because of fewer diffraction related limitations at these wavelengths. However, in some configurations larger wavelengths are desired. The wavelengths that can be used in the present invention range from about 200 to 1700 nm. Current developments furthermore make it possible to transfer multiple signals through one channel. For this purposes either multi-wavelength or multi mode optical fibers are developed, and multiplexing/demultiplexing techniques are used. Preferably, for the wavelength of the modulated light beams is selected in an area which interferes as little as possible with the beamlets and with the rest of the system. This allows the optical transmitter to be designed almost independently from the rest of the lithography system.

In an embodiment of the invention, each modulator or the modulation means comprises a light sensitive element for converting said at least one modulated light beam coming from said control unit into a signal for actuating said modulator. In this way, the optical transmitter can be kept small. The transfer rates can be very high, and the modulator can for instance be made using lithographic technologies. In a further embodiment thereof, said optical transmitter comprise at least one optical fiber having a modulation means end and a control unit end, for transmitting said at least one modulated light beam from said control unit to said modulation means.

In an embodiment, the lithography system comprises at least one projector for projecting said at least one modulated light beam on said modulation means. In this way, it offers an even greater freedom of design. Furthermore, interference can be reduced.

In an embodiment with optical fibers, said at least one optical fiber at its modulation means end is coupled to one or more optical fiber arrays. In a further embodiment thereof, substantially each optical fiber from said one or more optical fiber arrays is coupled to one of said light sensitive converter elements.

In an alternative embodiment, said at least one optical fiber at its modulation means end is coupled to one or more optical waveguides, and said optical waveguides being coupled to the light sensitive elements.

In an embodiment of the maskless lithography system described above, said optical transmitter comprises at least one multiplexer at its control unit end and at least one demultiplexer at its modulation means end.

In another embodiment of the maskless lithography system described above, the system has an optical path parallel to which said plurality of beamlets are traveling, wherein said optical transmitter is furthermore provided with optical coupler for coupling said at least one modulated light beam into said optical path.

In embodiment described above, the data converter and the optical transmitter is adapted for generating at least one modulated light beam having at least one wavelength between 200 and 1700 nm. This wavelength was found to interfere as little as possible with the rest of the system. Furthermore, it allows use of many of-the-shelf components used in optical telecommunication applications.

In a further embodiment of the invention, each light sensitive element is provided with a selection filter which is transparent for a predetermined wavelength range, or a selection filter for transmitting light having a predetermined direction of polarization, or a prism which limits the sensitivity of said light sensitive element to light entering said prism from a predetermined direction, or a grating which limits the sensitivity of said light sensitive element to light entering said grating from a predetermined direction. In this way, x-talk can be reduced.

In a further embodiment of the maskless lithography system comprising optical fibers, said light sensitive element comprises a photodiode, in an embodiment a MSM-photodiode, a PIN-photodiode or an avalanche photodiode.

In an embodiment of the maskless lithography system with an optical fiber array, the modulator comprises an electrostatic deflector. Especially when the beam is a charged particle beam, this allows easy modulation, using parts which are well known in other fields of technology.

In an embodiment of the maskless lithography system according to the present invention, the data converter comprises a laser diode.

In an embodiment, the optical transmitter comprises at least one optical fiber having a modulation means end and a control unit end, for transmitting said at least one modulated light beam from said control unit to said modulation means, and at least one projector for projecting said modulation means end of said optical fiber or optical fibers on said modulation mean. In this way, a flexible design of the system is possible, both in lay-out and in choice of components.

In an embodiment, each modulator of the modulation means comprises a light sensitive element for converting said at least one modulated light beam coming from said control unit into a signal for actuating said modulator, and said modulation means has a beam generating means side and a target side.

In an embodiment, each of said modulators comprise at least one electrostatic deflector, an aperture between said at least one electrostatic deflector and said target side, said electrostatic deflectors of said modulators defining an electrostatic deflector array and said apertures of said modulators defining an aperture array.

In a further embodiment, each electrostatic deflector is operationally coupled to a light sensitive element.

In this embodiment, said optical transmitter comprises at least one beam splitter for splitting said at least one modulated light beam into a plurality of modulated light beams.

In a further embodiment, the optical transmitter comprises projectors for projecting said plurality of modulated light beams on said light sensitive elements.

In this embodiment, said projector are adapted for projecting at an angle between 0 and 88 degrees relative to a plane perpendicular to said electrostatic deflector array. In this embodiment. In a further embodiment, the projector comprises at least one lens for projecting the plurality of modulated light beams on said electrostatic deflector aperture array.

In an embodiment, the projector comprise a first demagnifier with a reduction optical system for demagnifying the plurality of modulated light beams and a projection optical system for projecting the demagnified plurality of modulated light beams on said electrostatic deflector aperture array. In an embodiment thereof, said reduction optical system comprises a micro lens array, each micro lens of said micro lens array being aligned with one of said plurality of modulated light beams and adapted for reducing the size of said one of said modulated light beams. In a further embodiment thereof, said projection optical system further comprises a mirror, for reflecting the plurality of modulated, demagnified light beams coming from the reduction optical system in the direction of said lens of the projection optical system.

In an embodiment of the electron beam maskless lithography system described above, the area on the modulation means not covered by the light sensitive elements is provided with a reflective layer.

In an embodiment of the electron beam maskless lithography system described above, a diffusive layer is provided on the surface of the modulation means facing the incoming plurality of modulated light beams.

In an embodiment, said optical transmitter further comprises an optical waveguide for coupling each of the plurality of modulated light beams substantially parallel to the electrostatic deflector aperture array plane towards its corresponding light sensitive element. In a further embodiment thereof, the optical transmission means further comprises an optical micro lens array provided with a plurality of micro lenses, each micro lens being aligned with one of said plurality of modulated light beams for coupling its modulated light beam into a corresponding optical waveguide.

In an embodiment, the optical transmitter comprises a plurality of optical fibers, the data converter means comprising means for coupling said at least one modulated light beam in said plurality of optical fibers, said plurality of optical fibers being grouped to form at least one fiber ribbon, said at least one fiber ribbon being attached at one of the sides of said electrostatic deflection array, and the light sensitive elements being adapted for electrically activating their corresponding electrostatic deflector via electrical interconnects.

In another embodiment, the maskless lithography system, the generating means comprise light beam generating means. In an embodiment thereof, the light generating means are adapted for generating a light beam having a wavelength smaller than 300 nm. In a further embodiment thereof, the modulation means comprises a spatial light modulator. In a further embodiment thereof, the spatial light modulator comprises a deformable mirror device, comprising an array of micro-mirrors. In yet a further embodiment thereof, each micro-mirror comprises a light sensitive element mounted on its backside coupled to said optical transmission means for receiving a modulated light beam.

The invention further relates to a process wherein a maskless lithography system is used described above.

The invention further relates to a method for transferring a pattern onto the surface of a target using a lithography system comprising beam generator for generating a plurality of beamlets and modulation means for individually controllably modulating substantially each beamlet, said method comprising: retrieving pattern data from data storage; transforming said pattern data into at last one modulated light beam; optically coupling said at least one modulated light beam to said modulation means.

In an embodiment of this method the modulation means comprise an array of modulators, each provided with light sensitive elements, and method further comprises: directing said at least one modulated light beam onto said modulators; coupling each of said modulated light beams to one light sensitive element.

DRAWINGS

Figure 4:
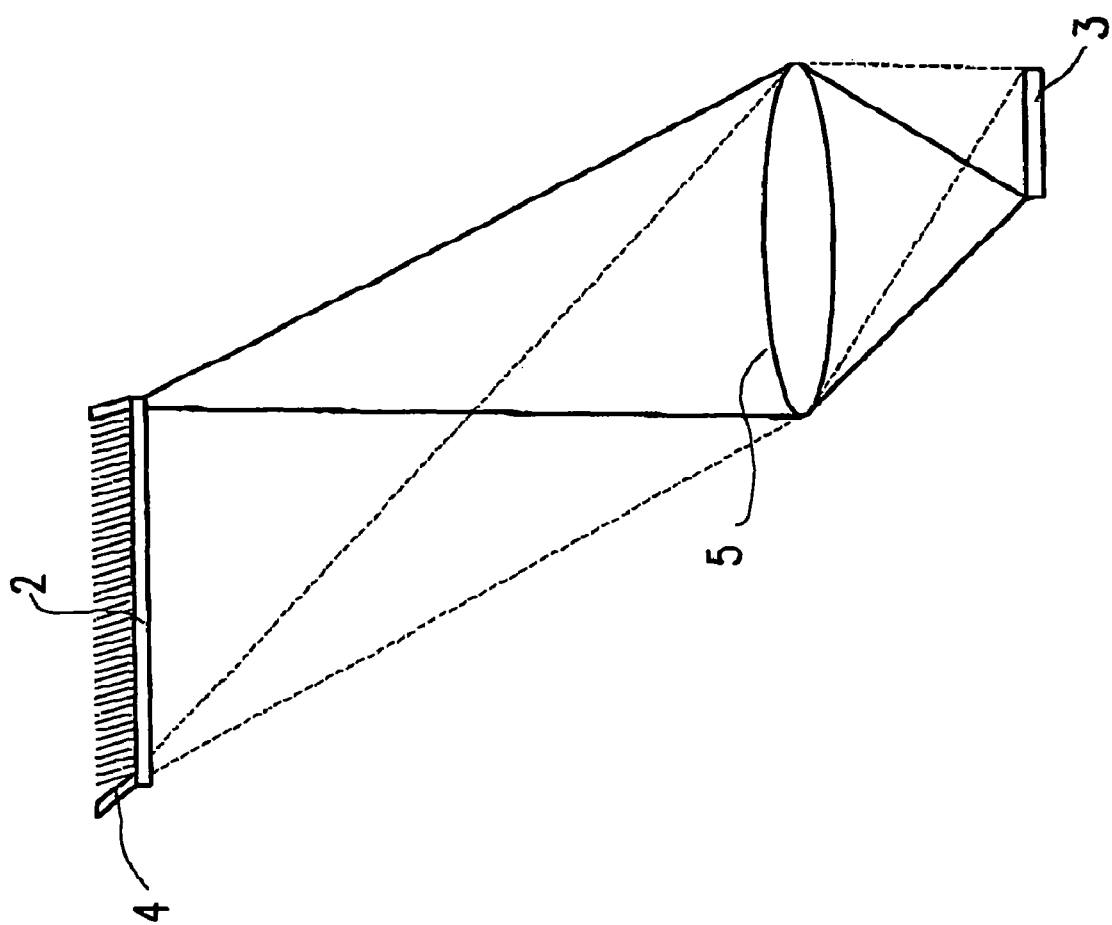
Figure 6A:
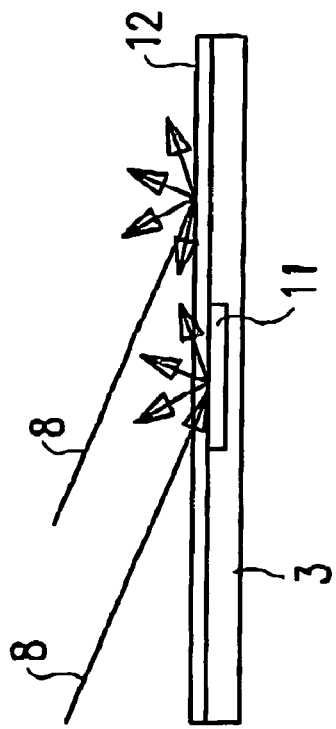
Figure 6B:
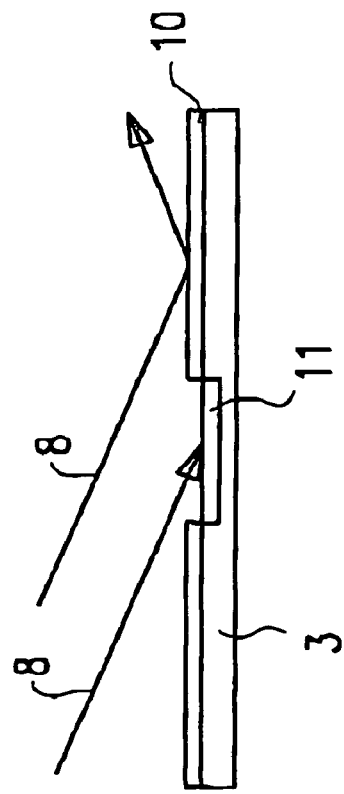
Figure 6C:
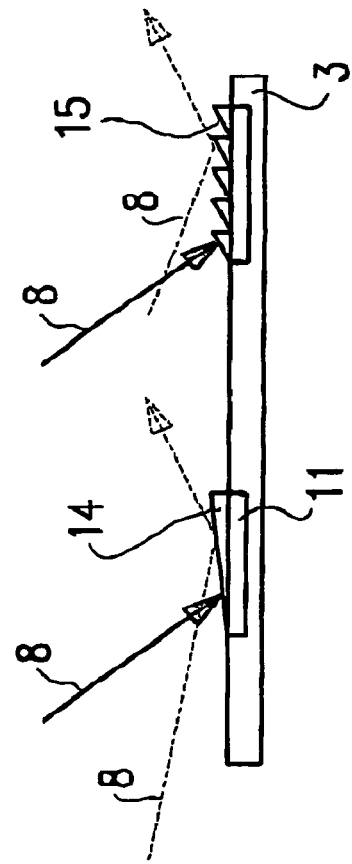
Figure 6D:
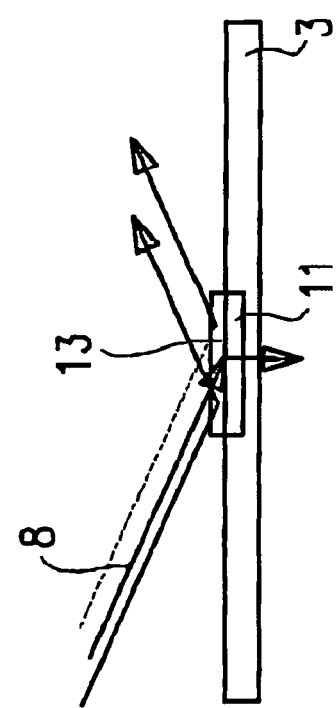
Figure 7:
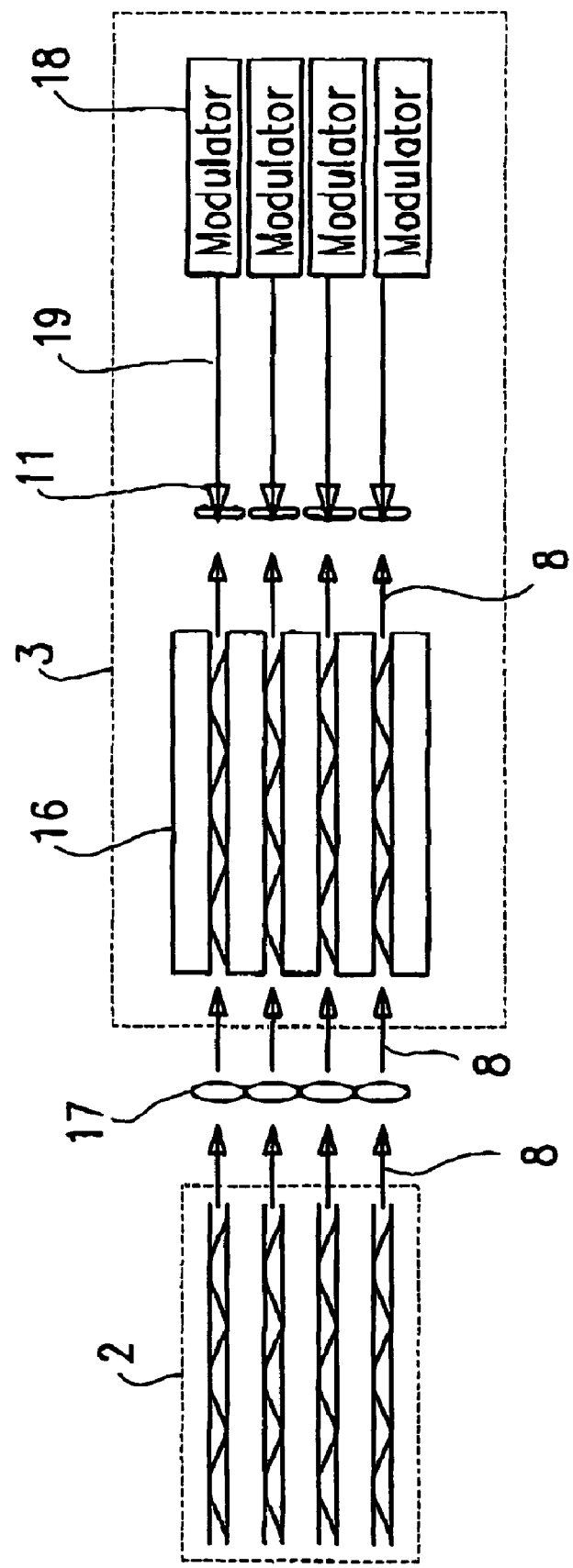
Figure 8:
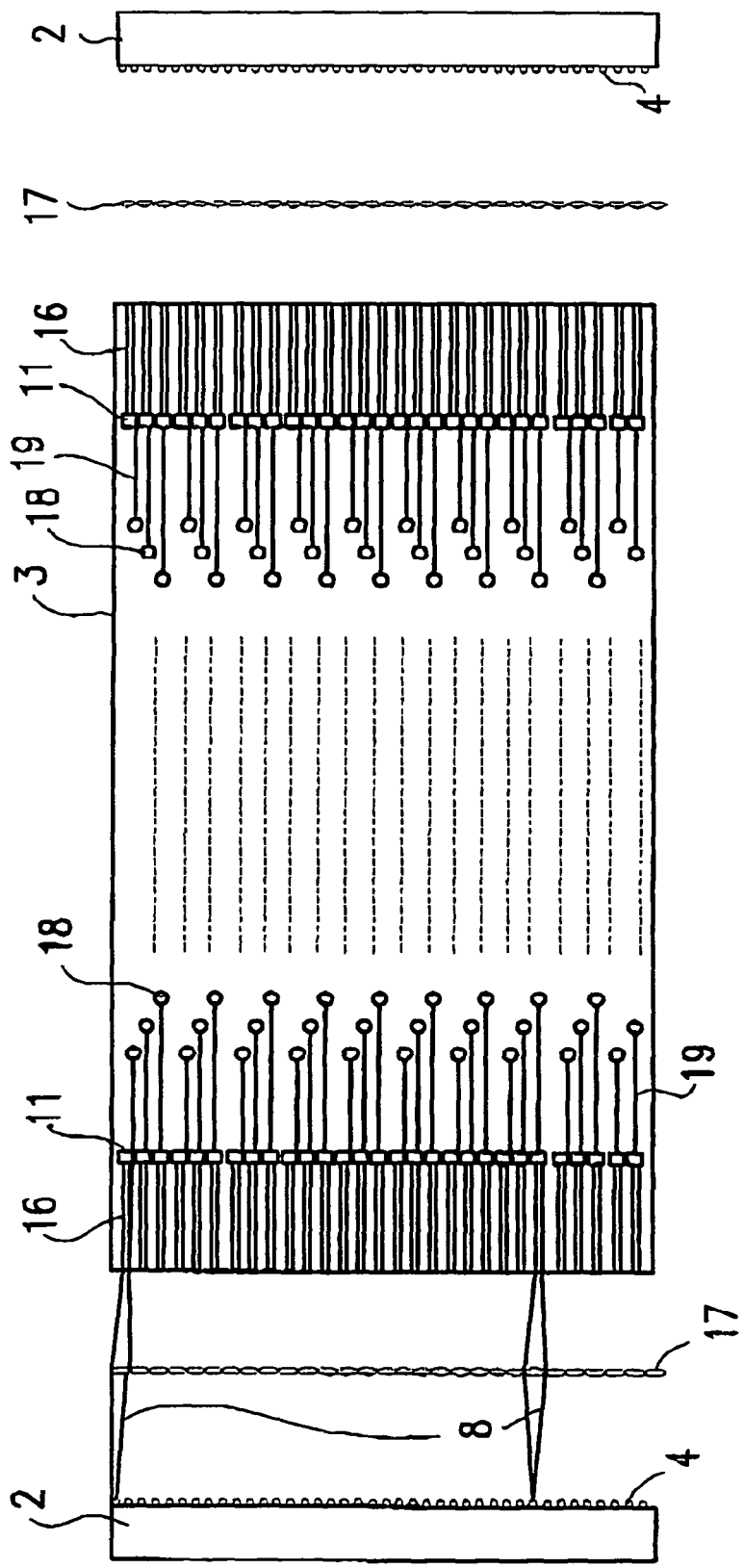
Figure 9:
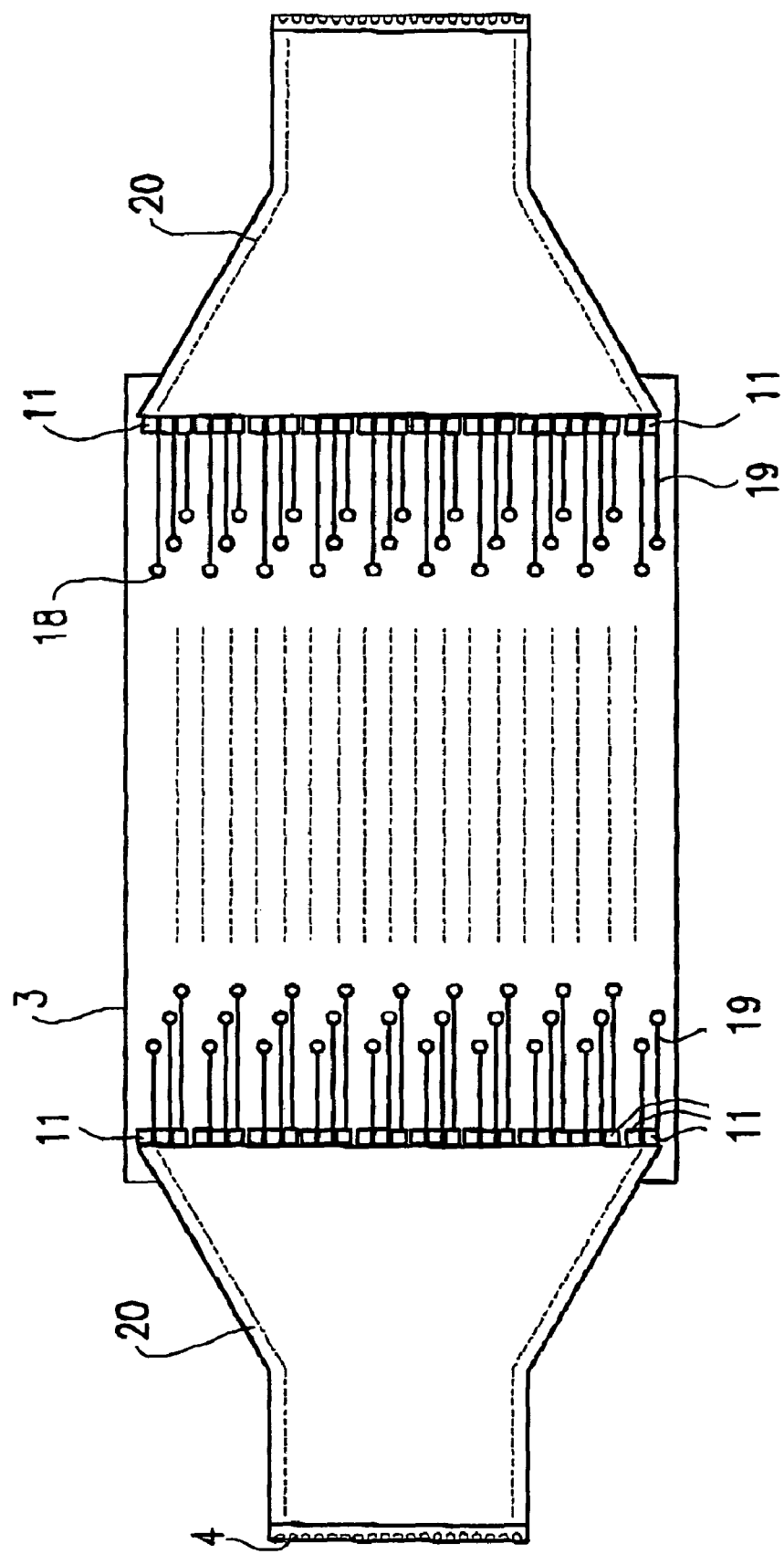
Figure 10:
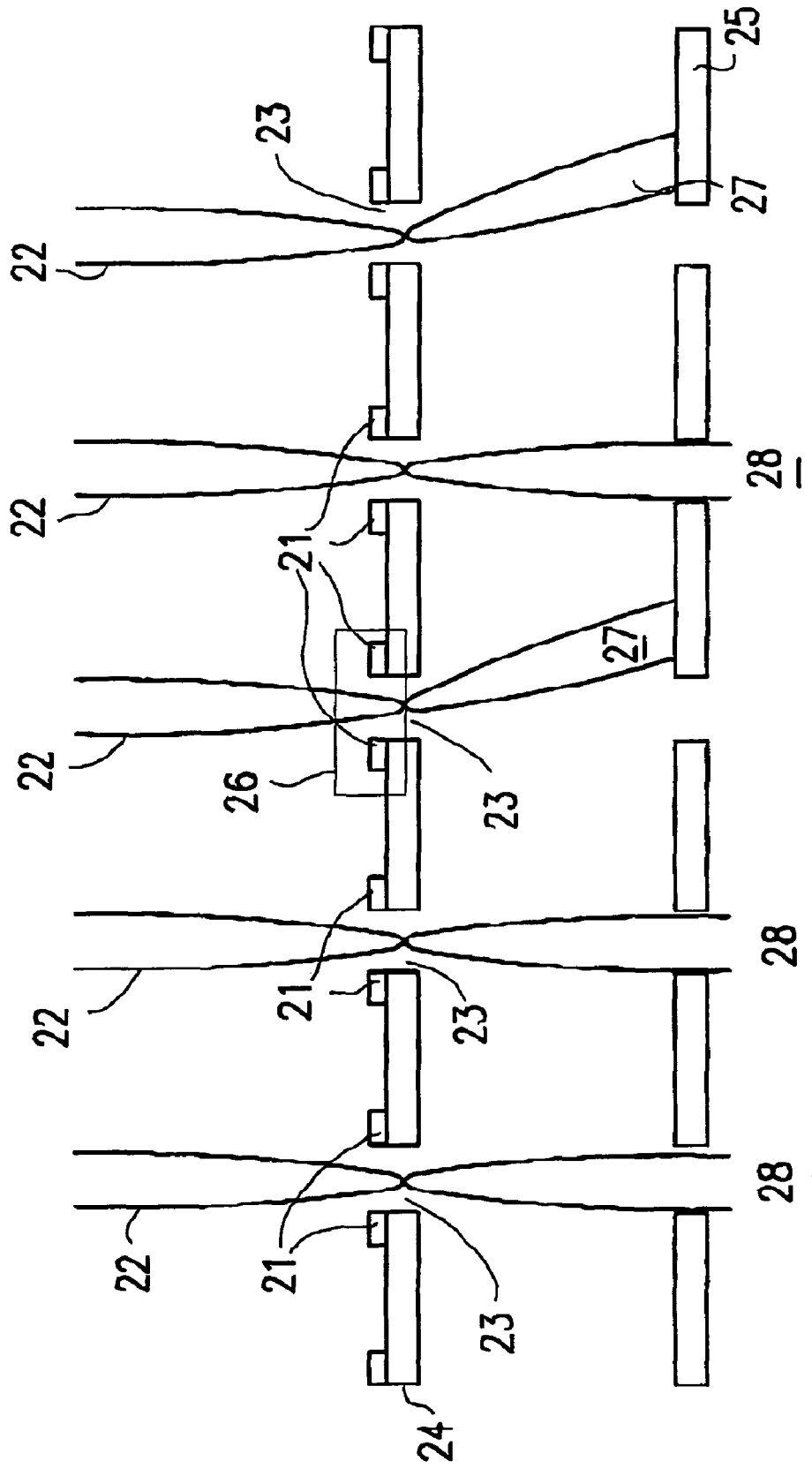
Figure 11:
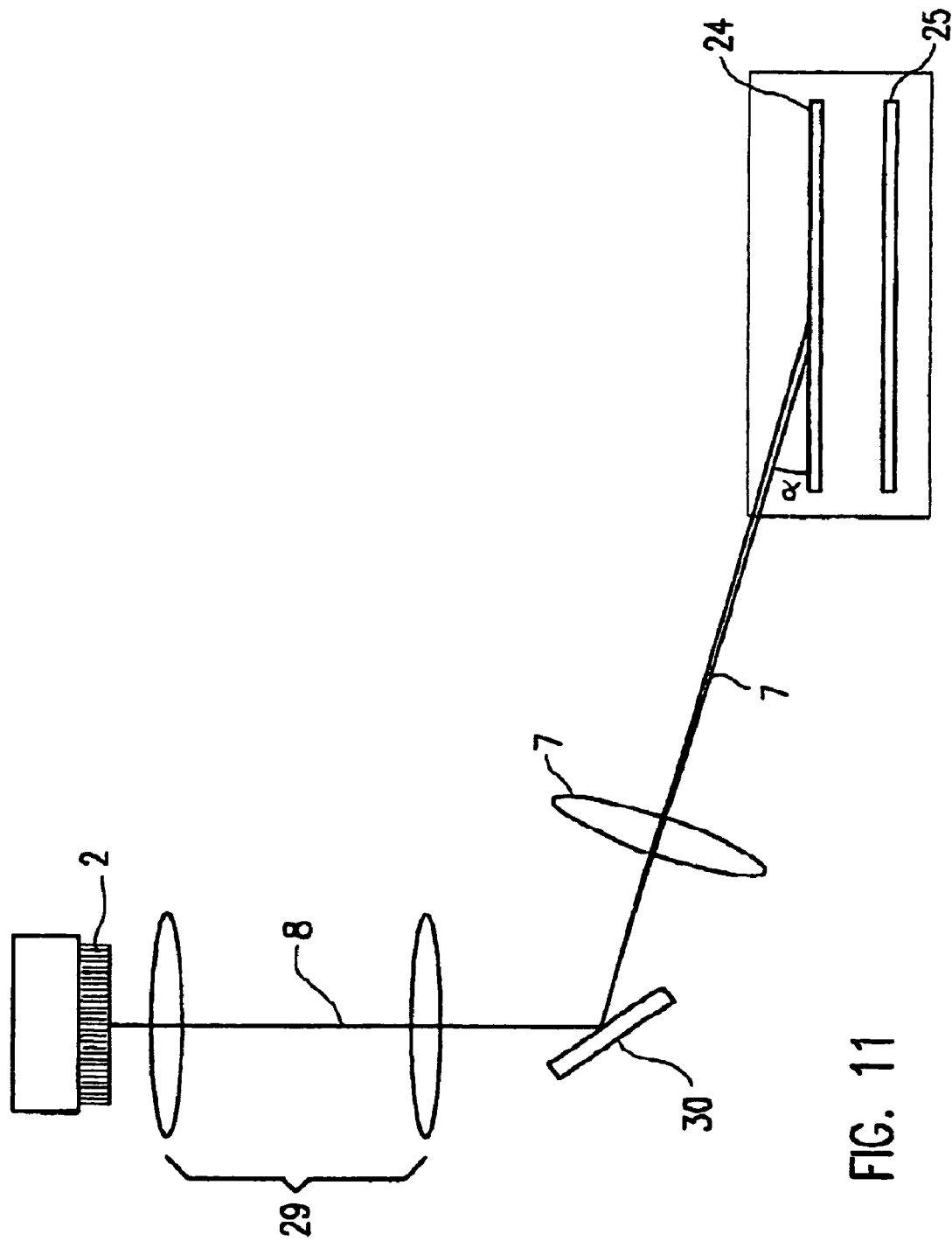
Figure 12:
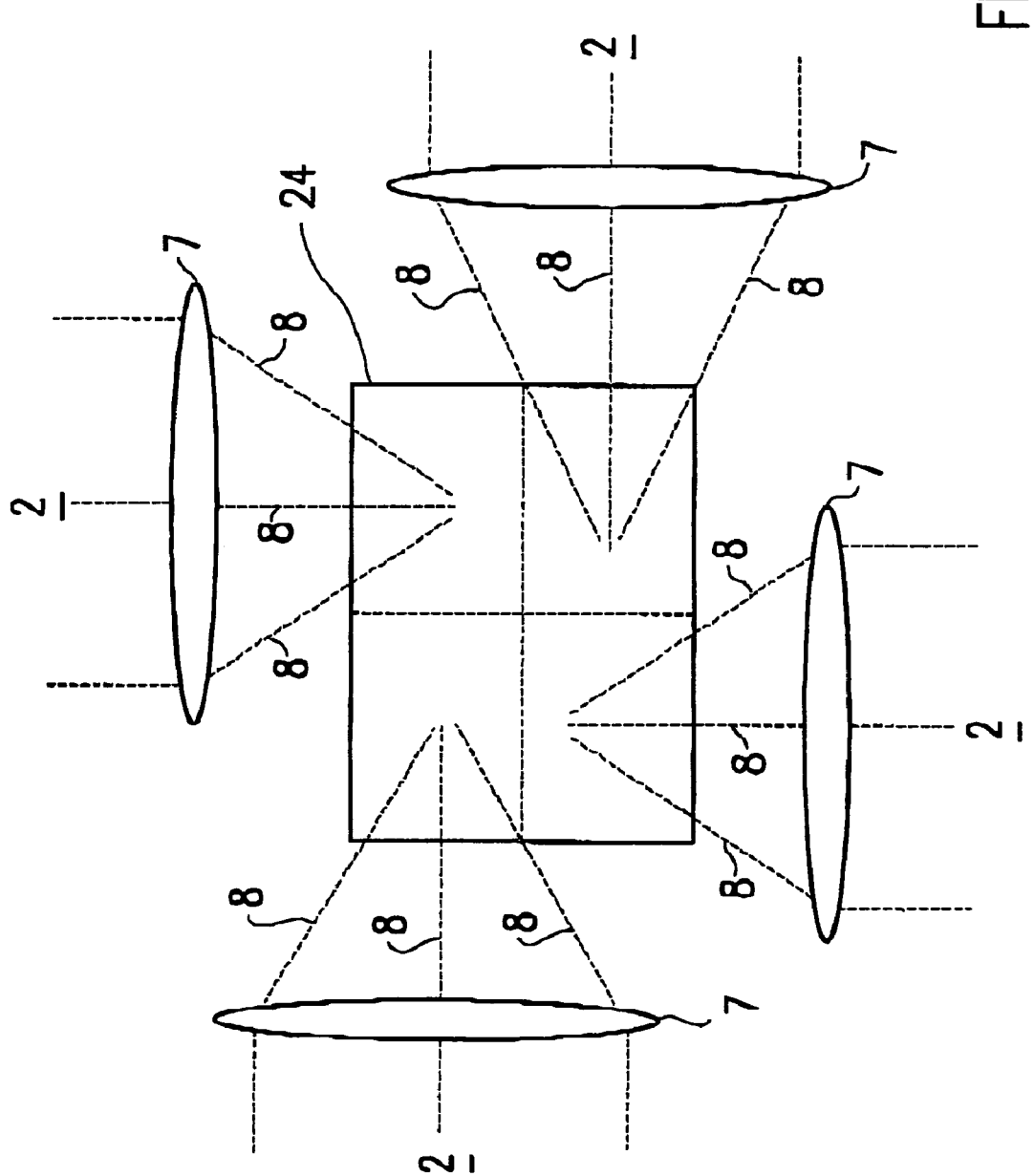
Figure 13:
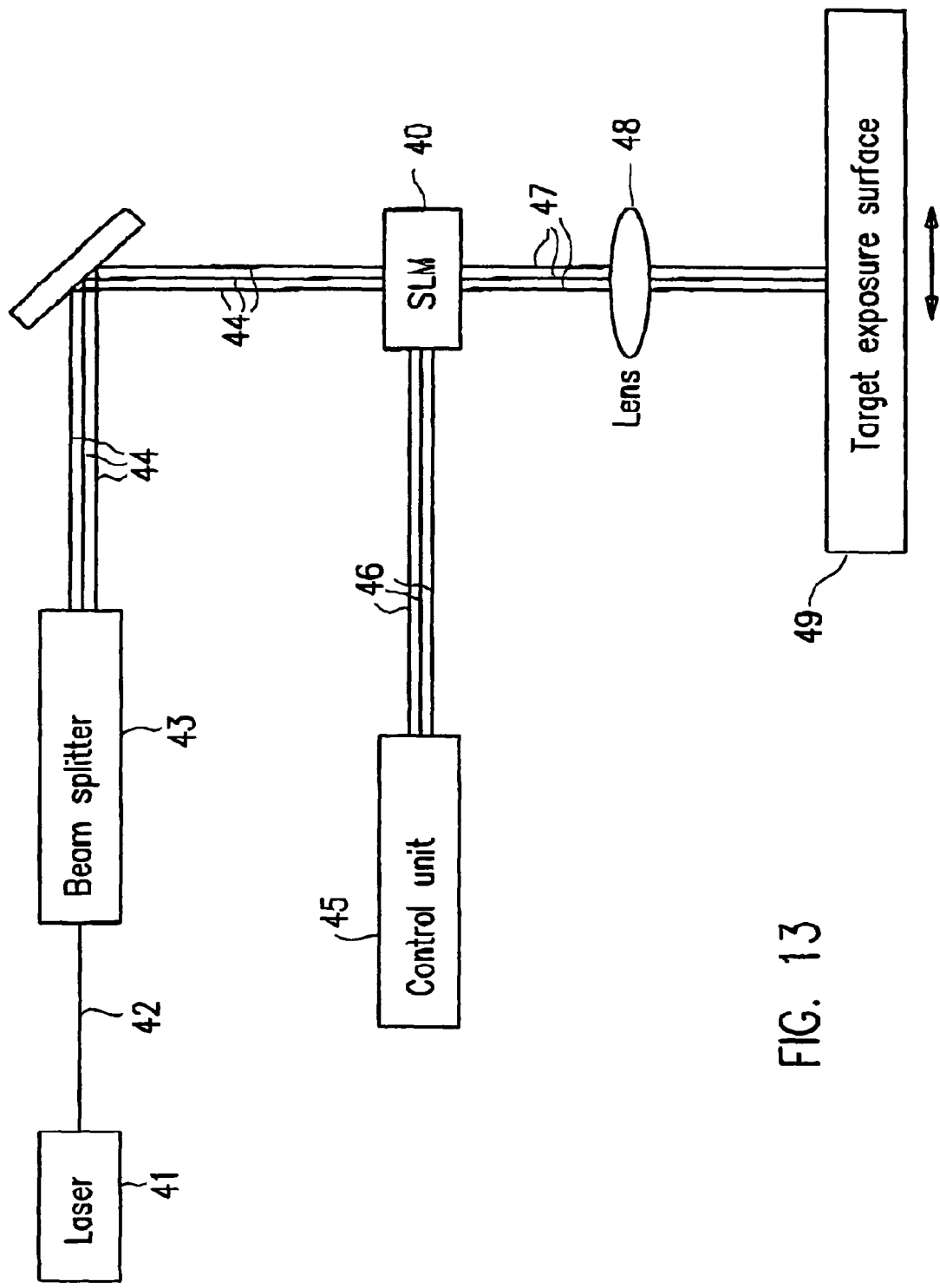
Figure 14:
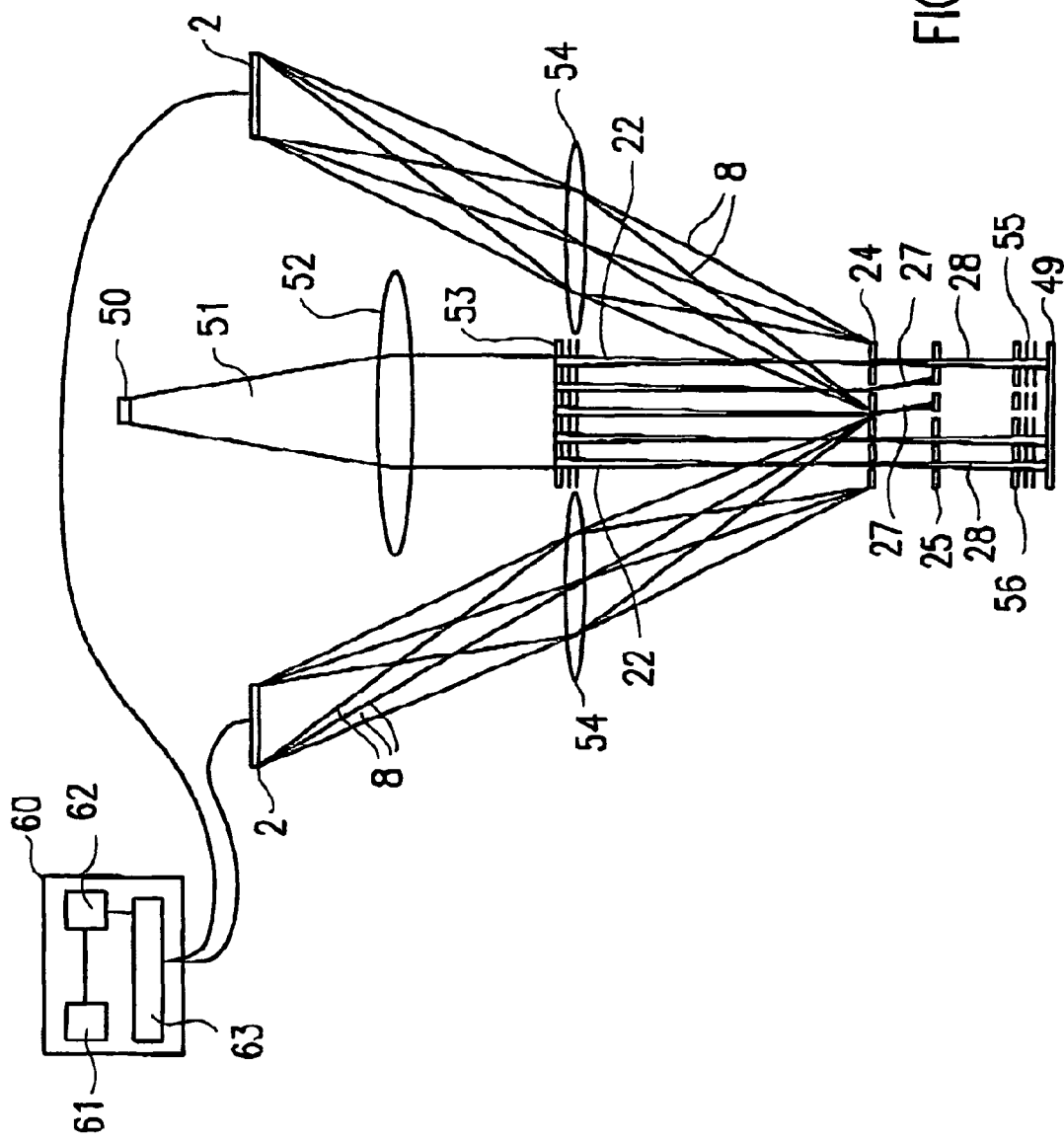

The invention will be further elucidated in the following embodiments of a maskless lithography system according to the current invention, in which:

FIGS. 1A, 1B an operation scheme of part of the system of the invention,

FIGS. 2A, 2B, 2C free space optical coupling,

FIGS. 3A, 3B illumination schemes of a modulation means,

FIG. 4 projection of optical fiber array on modulation array;

FIGS. 5A, 5B projection systems for projecting a pattern information carrying light beam on modulation means, FIGS. 6A-6D illuminating schemes for the light sensitive elements, FIG. 7 coupling of pattern information carrying light beams to light sensitive elements, FIG. 8 top-view or FIG. 7, FIG. 9 optical coupling using optical fiber ribbons, FIG. 10 modulation means for an electron beam lithography system, FIG. 11 free space coupling of pattern information carrying light beams to modulation means, FIG. 12 illumination scheme of a modulation means, FIG. 13 maskless optical lithography system, FIG. 14 projection of fiber ends on modulation means

DETAILED DESCRIPTION OF THE INVENTION

Since the modulation means are fed with an optical signal, they each comprise a light sensitive clement, preferably a photodiode. The basic operation of the modulation means is schematically shown in FIG. 1A. FIG. 1a schematically shows the basic operational steps performed by the modulation means. Each modulation means is provided with a light sensitive element, preferably a photodiode, to be able to receive an optical signal.

If the light sensitive element receives light, a signal is generated and sent to modulator. As a result the passing beamlet will be modulated and not reach the target exposure surface. If there is no light, there is no signal transferred to the modulator. The beamlet passes undisturbed, and finally reaches the target exposure surface. By moving the target exposure surface and the rest of the lithography system relative to each other while sending pattern information towards the modulation means, a pattern can be written.

It is of course also possible to operate the whole system in the opposite way as shown. In FIG. 1B. In this case light falling on the light sensitive element results in the cancellation of the signal sent towards the modulation means. The passing beamlet will reach the target exposure surface without any modulation. However, when the light sensitive element does not receive light, a signal is sent towards the modulation means, which prevents the passing beamlet from reaching the target exposure surface.

The attachment of the optical fibers to the modulation means can give serious complications. In an embodiment of the present invention, the last part or the data trajectory therefore uses a different transfer medium. In the latter case the fibers terminate closely packed thus forming an optical fiber array. The emitted pattern information carrying light beams are then sent towards other optical carriers. When the modulation means are located in a vacuum, it might be preferable to keep the optical fibers outside the vacuum. In this case the emitted light beams can for instance couple into the lithography system via a transparent part of the vacuum boundary.

In most cases it is not practical to bring the pattern information carrying light beams all the way to the light sensitive elements through optical fibers. In that case other optical carriers can continue the data transfer. Preferably the optical fibers are bonded together to form an optical fiber array. The pattern information carrying light beams then travel towards the light sensitive elements in a different way. One possible way of data transfer is to send the light emitted from the fibers towards the light sensitive elements of the modulation means through the same environment as wherein the irradiated beamlets are traveling. In this way free space optical interconnects are created. Another possible transport medium is an optical wave-guide, which is located in the structure of the modulation means.

In the case of an optical wave-guide or an optical fiber, multiple wavelengths can be transported through the channels as is commonly done in telecommunication applications. The space occupied by the transfer medium then reduces significantly, because several pattern information carrying light beams share the same channel. The conversion towards a signal that can be used by the modulators can be made with an opto-electronic receiver, like a DWDM multi-wavelength receiver.

The light sensitive element can be any element known in the art that converts an incoming light signal into any other kind of signal, like an electric or an acoustic signal. Examples of such converters are photo cathodes, phototransistors, photo resistances and photodiodes. In order to meet the high data rate requirements, the light sensitive element should have a low capacitance, enabling it to operate at a high frequency. Moreover the element is preferably easy to integrate in the modulation means. There are photodiodes that meet the demands mentioned above. The preferred embodiment uses an MSM-photodiode. The main advantage of this photodiode is its low capacitance. It is therefore able to operate at a high frequency. Moreover, the fabrication of a MSM-photodiode is relatively easy. Another good option would be the use of a PIN-photodiode. This element also has a low capacitance, but it is somewhat more difficult to integrate this component in an array. Another very useful option is an avalanche photodiode.

As mentioned earlier, the data rate and thus the required modulation frequency are very large. In order to be able to modulate at this rate, suitable switching circuitry is important. Besides the three optical carriers, which will be discussed below, other related means to transfer modulated light beams are embodied by the present invention.

Transfer Options

Free Space Optical Interconnects

When the pattern information carrying light beams are projected on the corresponding light sensitive elements through the same medium as wherein the irradiated beamlets are traveling, several complications arise. It is often not possible to project the pattern information carrying light beams on the light sensitive elements perpendicular to the plane wherein the light sensitive element is located. This can for instance be the case when the irradiated beamlets are already projected perpendicular to said plane. The interference between the beamlet and the pattern information carrying light beam might have an influence on the pattern, which results in an incorrect data transfer from control unit towards target exposure surface. To avoid this problem the pattern information carrying light beams reach the light sensitive surface of the light sensitive element, say a photodiode, at a certain angle However, when this angle of incidence a increases, the spot size of the pattern information carrying light beams on the light sensitive surface of the photodiode increases as well. In order to address each photodiode individually, the spot size of the pattern information carrying light beams should be less than the light sensitive surface area or the photodiode. The angle of incidence .alpha. should therefore be as small as possible. However, this is not always possible due to obstacles as shown in FIG. 2A.

With a smart choice of the location of both fiber array 2 and obstacle 1, some of the problems may be avoided. However, this is not always possible. The present invention includes ways to reduce the angle of incidence .alpha. without removal or replacement of the obstacle 1. A first option is to make the obstacle 1 transparent for the pattern information carrying light beams. If the barrier is for instance an electrostatic lens array, it can for instance be made of some kind of conductive glass or polymer. Alternatively, the wavelength of the pattern information carrying light beams can be chosen in such a way that the obstacle 1 becomes transparent for these beams. Silicon, for instance, becomes transparent for wavelengths larger than 1100 nm. So when a standard fiber wavelength of 1500 nm is used, the emitted beams will pass the silicon barrier without noticing its existence.

Another possibility to reduce the angle of incidence .alpha. without removing the obstacle 1 is to use more optical fiber arrays 2. In FIG. 2A a situation is sketched wherein the pattern information carrying light beams leaving the fiber array 2 are projected on a plate 3 covered with modulators. The emitted beams cover the total plate 3. If in this configuration the projected spot size is too large, the angle of incidence can be reduced by moving the fiber array 2 away from the modulation means plate 3 perpendicular to the plane wherein the photodiodes are deposited as is shown in FIG. 2B. As a result the critical angle of incidence .alpha. 1 is reduced. Now the spot size may be limited within the requirements. However, only half of the plate 3 is illuminated. By using a second fiber array 2 at the same height at the opposite side of the modulation plate 3 as shown in FIG. 2C, the entire plate 3 is illuminated and the spot size is small enough. Both optical fiber arrays 2 comprise halt the amount of fibers compared to the original one. By selecting the right amount of optical fiber arrays 2, a plate provided with an array of light sensitive elements can be illuminated with the desired angle of incidence $.alpha._1$.

FIGS. 3A and 3B show a top view of a squared and a rectangular modulation plate 3. The dotted lines bound the area illuminated by one fiber array. As already explained earlier, one fiber array may not be enough. In that case for instance 2, 4 or 6 optical fiber arrays 2 can be used to illuminate the entire plate within the requirements.

Furthermore it is possible to couple the pattern information carrying light beams into the system via some reflections. The obstacle 1 can for instance be coated with a reflective material. Moreover additional mirrors can be placed on strategic positions in the system to create the desired angle of incidence.

The pattern information carrying light beam has a diameter of about 50-150 μm when a multi mode optical fiber is used. A single mode fiber, on the other hand, only has a diameter of about 1-10 μm. The light sensitive surface of a photodiode can be in the order of 10-30 microns squared.

In an embodiment, multi mode optical fibers are used, so the diameter of the pattern information carrying light beams leaving the optical fiber array needs to be reduced. Furthermore some kind of focusing has to be arranged to realize projection with the correct resolution.

An optical assembly may be needed to perform both reduction and focusing of the pattern information carrying light beams. There are several properties of the light beams that can easily be modified. The diameter of the light beams leaving the optical fiber array 2 can be demagnified, and/or the distance between two adjacent light beams, the so-called pitch, can be reduced by optical means.

Focusing light beams leaving the optical fiber array 2 on the modulation plate 3 can most easily be achieved when both optical fiber array 2 and modulation array 3 are lying parallel to each other. If the two planes are not parallel the spot size of each individual light beam on the modulation array 3 will vary. The projection of the fiber array 2 on the modulation plate 3 is done with a lens 5. Often the light beams are projected on the modulation plate 3 with an angle of incidence unequal to zero. The optical fibers 4 in the optical fiber array 2 may then be arranged in such a way that the light beam leaving the optical fiber is directed towards the lens as is shown in FIG. 4. In this way a sufficient illumination of the lens s is ensured.

When the lens 5 is located exactly in the middle between the optical fiber array 2 and modulation plate 3, 1:1 projection takes place. Moving the lens towards the modulation plate 3 reduces both diameter and pitch of the pattern information carrying light beams. Moving the lens 5 in the other direction, i.e. in the direction of the optical fiber array 2, will result in an increase of both parameters.

For an optimum performance regarding both reduction and projection more lenses may be needed. A possible configuration with two lenses 6 and 7 is shown in FIG. 5A. The entire image and thereby the diameter of each individual pattern information carrying light beam 8 leaving the optical fiber array 2 is reduced. In an embodiment with obstacles, mirrors can be used to project the light beams on the light sensitive elements.

In some cases the beam diameter needs to be reduced more than the pitch between the adjacent light beams. In FIG. 5B, an alternative embodiment is shown. In this embodiment, a micro lens array 9 positioned between the optical fiber array 2 and a projection lens 7 can arrange this. Each individual lens of the micro lens array corresponds to a single fiber 4 in the optical fiber array 2. The diameter of each pattern information carrying light beam 8 leaving the optical fiber array 2 is individually demagnified in this configuration as depicted in FIG. 5B. A projection lens 7 focuses all the demagnified beams onto the corresponding light sensitive elements. When direct projection is impossible due to some obstacle, mirrors can be used to project the pattern information carrying light beams on the light sensitive elements at the desired angle of incidence .alpha..

Another potential problem related to the spot size, cross talk between adjacent pattern information carrying light beams emitted from the fiber array 2, can be reduced by applying several measures. Consider again that the beams are projected on an array of modulation means wherein the light sensitive surfaces of for instance photodiodes are all lying within one plane at one side of the array.

A solution to this cross talk problem is depicted in FIG. 6A. The area between adjacent light sensitive elements is covered with a reflective layer 10. The major part of the incoming light beam falls on the light sensitive converter element 11. The part of the light beam that is not falling on the element 11 is reflected back into the system, without affecting any of the adjacent elements. Coating the light sensitive elements 11 with an anti-reflective layer can enhance the light detection efficiency even further.

Cross talk can also be reduced using a diffusive layer 12 on top of the entire array 3, as shown in FIG. 6B. The incoming light is now scattered in all directions. Due to scattering, the light intensity of the reflected beam drops dramatically.

Yet another way to reduce the cross talk is to use a filter located on top of the light sensitive converter element 11. Examples are a wavelength filter 13 as shown in FIG. 6C, or a polarization filter. The wavelength filter 13 enhances the selectivity for a certain wavelength. As a result, waves coming from adjacent patterned beams with a slightly different wavelength are filtered out. A filter only transmitting light polarized in a predetermined direction works has the same effect.

Yet another possible measure is to make the light sensitive elements 11 only sensitive for light coming from a predetermined direction, for instance by incorporating small prisms 14 or gratings 15 in the modulation array 3 as depicted in FIG. 6D. Only the light falling on the light sensitive element 11 at the correct angle and coming from the right direction is used in the modulation process. Light coming from all other directions is excluded.

Optical Wave-Guides

A second possibility to transfer the pattern information carrying light beams leaving the optical fiber array 2 towards the light sensitive elements 11 embedded in the modulation means is the use of planar optical wave-guides. Planar optical wave-guides can be thought of as optical fibers embedded into or onto a substrate. Consider again the array of modulation means 3. When planar optical wave-guides are integrated in this array, a system as schematically shown in FIG. 7 is constructed. Each individual pattern information carrying light beam 8 leaving the optical fiber array 2 has to be coupled into the corresponding optical wave-guide 16 directly or via an array of lenses 17 as shown in FIG. 7. Each lens then couples an individual pattern information carrying light beam 8 into the entrance point of the corresponding planar optical wave-guide 16. The optical wave-guide 16 transports the pattern information carrying light beam 8 through the modulation array 3 towards the correct light sensitive element 11. The light sensitive element 11 converts the pattern information carrying light beam 8 into a sequence of signals, which activate or deactivate the modulators 18. Consequently the incoming beamlet will be controlled according to the pattern information. The sequence of signals in this embodiment is transported through electric wires 19 embedded in the modulation array 3 towards the modulators 18.

FIG. 8 shows a top view of the same configuration as depicted in FIG. 7. In this case two fiber arrays 2 are used to control all the modulators 18. However, any number of arrays 2 is applicable. The light sensitive elements 11 are represented by squares, the modulators 18 by circles. Only two trajectories of pattern information carrying light beams 8 are shown for clarity reasons.

Optical Fibers

A third possibility for the data transfer from the control unit towards light sensitive element 11 is to use optical fibers for the entire trajectory. The major problem with this approach is the connection of the individual fibers 4 to the structure wherein the modulation means are integrated. Again imagine that a modulation array 3 is used. Connecting the individual fibers 4 to this array 3 may give problems when for instance this array 3 is moving for scanning purposes. Mechanisms like stress and friction are introduced in the region of attachment. Eventually the connection can break. This can be avoided by combining a group of optical fibers 4 to form a fiber ribbon 20. The ribbon 20 is then connected at the side of the modulation array 3 as shown in FIG. 9, showing only two ribbons 20. Another number of ribbons 20 is also possible. Two exemplary trajectories of optical fibers within the fiber ribbon are schematically shown with dashed lines. The light sensitive elements 11, represented in the figure as squares, may be located close to the contact of the fiber ribbon 20 with the modulation array 3, but they may also be located closer to the incoming beamlets. Preferably the optical signals are converted in electric signals. These signals are transported through on chip electric wires 19 towards the modulators 19, represented by circles, located in close proximity of the corresponding incoming irradiated beamlets. The drawing only shows a number of the modulators present on the modulation array 3.

EXAMPLES

The next two sections describe two examples of maskless lithography systems embodied by the present invention.

Example 1

Maskless Electron Beam Lithography System (FIG. 10)

In the maskless electron beam lithography system used in this example, the system comprises an aperture plate comprising electrostatic deflectors 21 to deflect incoming electron beamlets 22 passing through the apertures 23. This plate will be referred to as the beamlet blanker array 24. When the electron beamlets 22 have passed the beamlet blanker array 24 they will reach a second aperture array (beam stop array) 25 on which their trajectory will terminate when they are deflected.

The modulation concept of this lithography system is shown in FIG. 10. Incoming electron beamlets 22 are projected on the beamlet blanker array 24. The positions of the electron beamlets 22 correspond to the positions of the apertures 23 in the plate 24. The beamlet blanker plate 24 comprises a deflector element as modulation means. In this example said deflector element comprises an electrostatic deflector 21. Depending on the received information the deflector 21 located in the beam blanker array 24 will be turned on or off. When the deflector 21 is turned on, an electric field is established across the aperture 23, which results in a deflection of the beamlet 22 passing this aperture 23. The deflected electron beamlet 27 will then be stopped by the beamlet stop array 25. In this case no information will reach the target exposure surface When the deflector 21 is turned off the beamlet will be transmitted. Each transmitted beamlet 28 will be focused on the target exposure surface. By moving the target exposure surface and the assembly of arrays relatively to one another and by scanning the beamlets with for instance an additional beamlet deflector array a pattern can be written.

FIG. 11 shows a possible configuration of the usage of free space interconnects in this maskless lithography system. The pattern information carrying light beams B coming out of and leaving the optical fiber array 2 of the optical transmitter are demagnified by two lenses 29. Alternatively also other configurations as for instance shown in FIG. 5 can be used. The pattern information carrying light beams 8 are then projected on the beamlet blanker plate 24 with a mirror 30 and a focusing lens 7. The angle or incidence .alpha. ranges from 0 and 80 degrees. If .alpha. is larger than 80 degrees or a smaller angle is desired due to other complications the beamlet blanker plate 24 can be illuminated with more than one fiber array 2 as is shown in FIG. 12. In the depicted situation of FIG. 12, 4 fiber arrays 2 illuminate the beamlet blanker plate 24. In FIG. 12 the 4 corresponding focusing lenses 7 are depicted, focusing the pattern information carrying light beams 8 on the respective part of the beamlet blanker plate 24.

Example 2

Maskless Optical Lithography System (FIG. 13)

The maskless lithography system in this example comprises a spatial light modulator (SLM) 40. Maskless lithography systems using an SLM are in a general way disclosed in WO 0118606. The SLM comprises an array of mirrors, which reflect the incoming light beams in such a way that the beam eventually is blanked or transmitted. An example of such an SLM is a deformable mirror device (DMD). A DMD is controlled in the same way as the electrostatic deflector array shown in the first example. The modulation signals couple into the system from the back or from the side.

One configuration is a backside control of the modulation. By providing the backside of each mirror with a light sensitive element, the control can be done with the use of the same optical carriers as mentioned before. Probably the use of free space optical interconnects is the most convenient option.

A schematic drawing of the operation is shown in FIG. 13. A laser 41 emits a light beam 42, which is split into a plurality of beamlets 44 by a beam splitter 43. The plurality of beamlets 44 is projected on the SLM 40. Pattern information carrying light beams 46 sent from the control unit 45 to the SLM 40 control the transmission probability of beamlets 44 coming from the beam splitter 43. The transmitted beamlets 47 are focused on the target exposure surface 49 using lens 48 (which can also be a lens system).

By moving the target exposure surface 49 and the rest of the system relatively to each other a pattern can be written.

In FIG. 14, an overall side view is shown of a lithography system in which the modulation means ends 2 of optical fibers are projected an modulator array 24 using optical system 54, represented by lenses 54. Modulated light beams 8 from each optical fiber end are projected on a light sensitive element of a modulator. In particular, ends of the fibers are projected on the modulator array. Each light beam 8 holds a part of the pattern data for controlling one or more modulators.

FIG. 14 also shows a beam generator 50, which generates a beam 50. Using an optical system 52, this beam is shaped into a parallel beam. The parallel beam impinges on beam splitter 53, resulting in a plurality of substantially parallel beamlets 22, directed to modulation array 24.

Using the modulators in the modulation array 24, beamlets 27 are deflected away from the optical axis O of the system and beamlets 28 pass the modulators undeflected.

Using a beam stop array 25, the deflected beamlets 27 are stopped.

The beamlets 28 passing stop array 25 are deflected at deflector array 56 in a first writing direction, and the cross section of each beamlet is reduced using projection lenses 55. During writing, the target surface 49 moves with respect to the rest of the system in a second writing direction.

The lithography system furthermore comprises a control unit 60 comprising data storage 61, a read out unit 62 and data converter 63. The control unit is located remote from the rest of the system, for instance outside the inner part of a clean room. Using optical fibers, modulated light beams holding pattern data are transmitted to a projector 54 which projects the ends of the fibers on to the modulation array 24.

It is to be understood that the above description is included to illustrate the operation of the preferred embodiments and is not meant to limit the scope of the invention.

The scope of the invention is to be limited only by the following claims. From the above discussion, many variations will be apparent to one skilled in the art that would yet be encompassed by the spirit and scope of the present invention.

The invention claimed is:

1. A method for transferring a pattern onto the surface of a target using a lithography system comprising:
   beam generating means for generating a plurality of beamlets, and
   a modulator plate for individually controllably modulating substantially each beamlet,
   wherein said modulator plate comprises planar array, each modulator of said array of modulators operationally coupled to a light sensitive elements, wherein light sensitive surfaces of the light sensitive elements are all provided on one surface of said modulator plate at one side of the modulation array, said one surface being substantially parallel to said modulator plate, said method comprising:
   retrieving pattern data;
   transforming said pattern data into at least one modulated light beam;
   optically coupling said at least one modulated light beam to said modulator plate via an optical transmitter for transmitting the at least one modulated light beam, carrying modulation data for modulating said beamlets, to said modulator plate,
   wherein said modulated light beams are projected from ends of fibers on said light sensitive elements and
   said optical transmitter comprising a group of optical fibers for transporting the at least one modulated light beam towards a respective light sensitive element of said modulators for converting such coupled light signal into an electrical signal for actuating an operationally coupled beam et modulator,
   wherein said group of optical fibers is combined together to form an optical fiber array, and
   wherein said fiber ends of the optical fiber array at the modulation array and the modulation array are lying parallel to each other, wherein said optical fiber array is connected to the modulation plate on said one side of the modulator array and wherein the optical fiber array is arranged for transporting the data from a control unit to a region close to the modulator plate.

2. The method of claim 1, wherein said method further comprising:
   splitting said at least one modulated light beam into a plurality of modulated light beams;
   coupling each of said modulated light beams to one light sensitive element.

3. The method of claim 1, wherein said method comprising the step of retrieving pattern data from data storage means.

4. A maskless lithography system for transferring a pattern onto the surface of a target, comprising:
   a beam generating means for generating a plurality of beamlets;
   a modulator plate comprising a plurality of modulators, each of said modulators provided operationally coupled with a light sensitive element, wherein each modulator is adapted for modulating the magnitude of a beamlet, wherein said plurality of modulators is included in a planar modulation array;
   a control unit for controlling each of the modulators, wherein the control unit produces and delivers pattern data to said modulator plate for controlling the magnitude of each individual beamlet, the control unit comprising:
   an optical transmitter for transmitting at least one modulated light beam, carrying modulation data for modulating said beamlets, to said modulator plate, said optical transmitter comprising a group of optical fibers for transporting the at least one modulated light beam towards a respective light sensitive element of said modulators for converting such coupled light signal into an electrical signal for actuating its operationally coupled beamlet modulator, wherein said group of optical fibers form an optical fiber array;
   wherein said modulated light beams are projected from the ends of said fibers on said planar modulation array and light sensitive surfaces of the light sensitive elements are all provided on one surface of said modulation plate at one side of the planar modulation array, said one surface being substantially parallel to said modulator plate; and
   wherein the fiber ends of the optical fiber array and the modulation plate are lying parallel to each other, wherein said optical fiber array is connected to the modulation plate on said one side of the modulation array and wherein the optical fiber array is arranged for transporting the data from the control unit to a region close to the modulator plate.

5. The system according to claim 4, wherein each modulator of the modulation plate comprises a light sensitive element.

6. The system according to claim 4, wherein two or more fiber arrays are used for controlling all of the modulators of the systems.

7. The system according to claim 4, wherein substantially every optical fiber from said one or more optical fiber arrays is coupled to one of said light sensitive converter elements.

8. The system according to claim 4, wherein said optical transmitter comprises at least one multiplexer at its control means end and at least one demultiplexer at its modulator plate end.

9. The system according to claim 4, wherein the optical transmitter is adapted for generating at least one modulated light beam having at least one wavelength between 200 and 1700 nm.

10. The system according to claim 4, wherein each light sensitive element is provided with a filter selected from the group comprising a selection filter which is transparent for a predetermined wavelength range, a selection filter for transmitting light having a predetermined direction of polarization, a prism for limiting the sensitivity of said light sensitive element to light entering said prism from a predetermined direction, and a grating for limiting the sensitivity of said light sensitive element to light entering said grating from a predetermined direction.

11. The system according to claim 4, wherein said light sensitive element comprises a photodiode.

12. The system according to claim 11, wherein said photodiode is a MSM-photodiode, a PIN-photodiode or an avalanche photodiode.

13. The system according to claim 4, wherein said modulator comprises an electrostatic deflector.

14. The system according to claim 4, wherein said light sensitive element comprises a laser diode.

15. The system according to claim 4, wherein said beam generating means comprises an electron beam generating means.

16. The maskless lithography system according to claim 4, each modulator of the modulator plate comprising a light sensitive element for converting said at least one modulated light beam coming from said control unit into a signal for actuating said modulator,
   said modulator plate having a beam generating means side and a target side, each of said modulators comprising at least one electrostatic deflector, an aperture between said at least one electrostatic deflector and said target side, said electrostatic deflectors of said modulators making up an electrostatic deflector array and said apertures of said modulators making up an aperture array, each electrostatic deflector being coupled to a light sensitive element, the light sensitive elements being located on the surface of the modulator plate facing the incoming plurality of modulated light beams.

17. The system according to claim 16, wherein said optical transmitter comprises:
   beam splitting means for splitting said at least one modulated light beam into a plurality of modulated light beams; and
   optical couplers for coupling each modulated light beam to a light sensitive element.

18. The maskless lithography system according to claim 16, wherein said at least one fiber ribbon is attached at one of the sides of said electrostatic deflection array.

19. The system according to claim 4, wherein the area on the modulator plate not covered by the light sensitive elements is provided with a reflective layer.

20. The system according to claim 4, wherein a diffusive layer is provided on the surface of the modulator plate facing the incoming plurality of modulated light beams.

21. A process wherein a maskless lithography system according to claim 4 is used.

22. The maskless lithography system according to claim 4, wherein said light sensitive elements are located close to an end of said fiber array.

23. The maskless lithography system according to claim 4, wherein said optical fiber array is arranged to form a fiber ribbon.

24. The maskless lithography system according to claim 23, wherein said fiber ribbon is connected to a side of the modulation array.

25. The maskless lithography system according to claim 4, wherein the light sensitive elements are integrated in the modulator plate.

26. The maskless lithography system according to claim 25, wherein the light sensitive elements are adapted for activating their corresponding modulators via on-chip electrical interconnects.

27. The maskless lithography system according to claim 4, wherein the modulated light beams are projected on the modulation plate perpendicular to the plane wherein the light sensitive elements are located.

28. The maskless lithography system according to claim 4, wherein said light sensitive elements are located in the vicinity of one or more individual modulators, and wherein said light beams are directed into a virtual space column defined by said plurality of parallel beamlets.

29. The maskless lithography system according to claim 4, wherein said group of optical fibers are bonded together.

30. The maskless lithography system according to claim 4, wherein said light sensitive elements are coated with an antireflective layer.

31. A maskless lithography system for transferring a pattern onto the surface of a target, comprising:
at least one beam generator (50, 52, 53) arranged to generate a plurality of beamlets (22), wherein said beam generator comprises an ion beam generating means or an electron beam generating means;
a modulation array (24) comprising a plurality of modulators (3, 18, 24) arranged to modulate the magnitude of a beamlet, wherein said modulators (3, 18, 24) comprise electrostatic deflectors (21);
a control unit (60) arranged to control each of the modulators, wherein the control unit (60) is arranged to generate and deliver pattern data to said modulation array (24) for controlling the magnitude of each individual beamlet, the control unit comprising;
at least one optical transmitter arranged to transmit at least one modulated light beam (8) holding pattern data for controlling one or more modulators for modulating said beamlets to said modulation array (24), said optical transmitter comprising a group of optical fibers (4) for transporting the at least one modulated light beam (8) towards a respective light sensitive element (11) of said modulators (3, 18, 24) for converting such coupled light signal into an electrical signal for actuating a related beamlet modulator (3, 18, 24); wherein said group of optical fibers are bonded together;
wherein the light sensitive elements (11) are integrated in the modulation array (24) and light sensitive surfaces of the light sensitive elements (11) are provided at one side of the modulation array (24); and
wherein the group of optical fibers (4) is connected at said side of the modulation array (24).

32. The maskless lithography system according to claim 31, wherein the group of optical fibers (4) is arranged for delivering the pattern data from the control unit (60) to a region close to the modulation array.

33. The maskless lithography system according to claim 31, wherein the light emitted from the group of optical fibers (4) is send towards the light sensitive elements (11) of the modulation array (24) through the same environment as wherein the plurality of beamlets travel.

34. The system according to claim 31, wherein two groups of optical fibers (20) are located on opposite sides of the plurality of modulators (18).

35. The system according to claim 31, wherein two or more groups of optical fibers (4) are used for controlling all of the modulators (3, 18, 24) of the system.

36. The system according to claim 35, wherein substantially every optical fiber from said two or more groups of optical fibers (4) is coupled to one of said light sensitive elements (11).

37. The system according to claim 31, wherein said optical transmitter comprises at least one multiplexer at its control means end and at least one demultiplexer at its modulation array end.

38. The system according to claim 31, wherein said light sensitive element (11) comprises a photodiode, preferably wherein said photodiode is a MSM-photodiode, a PIN- photodiode or an avalanche photodiode.

39. The system according to claim 31, wherein said modulator (3, 18, 24) comprises an electrostatic deflector (21).

40. The system according to claim 31, comprising a data converter (63) preferably in the form of a laser diode.

41. The maskless lithography system according to claim 31, wherein each modulator (18) of the modulation array (24) comprising a light sensitive element (11) for converting said at least one modulated light beam (8) coming from said control unit (60) into a signal for actuating said modulator (3, 18, 24), said modulation array (24) having a beam generating means side and a target side, each of said modulators (3, 18, 24) comprising at least one electrostatic deflector (21), an aperture (23) between said at least one electrostatic deflector (21) and said target side, said electrostatic deflectors (21) of said modulators (3, 18, 24) making up an electrostatic deflector array and said apertures (23) of said modulators (3, 18, 24) making up an aperture array, each electrostatic deflector being coupled to a light sensitive element, the light sensitive elements (11) being located at the beam generating side of said modulation array (24) and said electrostatic deflectors (21) being located between said light sensitive elements (11) and said aperture array.

42. The system according to claim 41, wherein said optical transmitter comprises a beam splitting means for splitting said at least one modulated light beam (8) into a plurality of modulated light beams (8), and optical couplers for coupling each modulated light beam to a light sensitive element (11).

43. The system according to claim 31, wherein the optical transmitter is adapted for generating at least one modulated light beam having at least one wavelength between 200 and 1700 nm.

44. The system according to claim 31, wherein each light sensitive element is provided with a filter selected from the group comprising a selection filter which is transparent for a predetermined wavelength range, a selection filter for transmitting light having a predetermined direction of polarization, a prism for limiting the sensitivity of said light sensitive element to light entering said prism from a predetermined direction, and a grating for limiting the sensitivity of said light sensitive element to light entering said grating from a predetermined direction.

45. The system according to claim 31, wherein the area on the modulation array not covered by the light sensitive elements is provided with a reflective layer.

46. The system according to claim 31, wherein a diffusive layer is provided on the surface of the modulation means facing the incoming plurality of modulated light beams.

47. The system according to claim 31, wherein said light sensitive elements are located close to an end of said group of optical fibers.

48. The system according to claim 31, wherein
said group of optical fibers is arranged to form a fiber ribbon.

49. The system according to claim 48, wherein said fiber ribbon is connected to a side of the modulation array.

50. The system according to claim 31, wherein
the light sensitive elements are adapted for activating their corresponding modulators via on-chip electrical interconnects.

51. The system according to claim 31, wherein
the modulated light beams are projected on the modulation array perpendicular to the plane wherein the light sensitive elements are located.

52. The system according to claim 48, wherein said at least one fiber ribbon is attached at one of the sides of said electrostatic deflection array.

53. The system according to claim 31, wherein said light sensitive elements are coated with an anti-reflective layer.

54. A method for transferring a pattern onto the surface of a target using a lithography system according to claim 31.

55. A method for transferring a pattern onto the surface of a target using a lithography system according to claim 54, wherein said method comprises:
  retrieving pattern data;
  transforming said pattern data into at last one modulated light beam (8);
  optically coupling said at least one modulated light beam (8) to said modulation array (24) via an optical transmitter arranged to transmit the at least one modulated light beam (8) holding pattern data for controlling one or more modulators for modulating said beamlets (22), to said modulation array (24),
  said optical transmitter comprising a group of optical fibers (4) for transporting the at least one modulated light beam (8) towards a respective light sensitive element (11) of said modulators (3, 18, 24) for converting such coupled light signal into an electrical signal for actuating a related beamlet modulator (3, 18, 24), wherein said group of optical fibers are bonded together, and wherein the group of optical fibers is connected at said side of the modulation array (24).

56. The method of claim 55, wherein said method further comprises:
  splitting said at least one modulated light beam (8) into a plurality of modulated light beams;
  coupling each of said modulated light beams (8) to one light sensitive element (11) wherein said method further comprises the step of retrieving pattern data from data storage means.

* * * * *

UNITED STATES PATENT AND TRADEMARK OFFICE
CERTIFICATE OF CORRECTION

PATENT NO. : 8,242,470 B2
APPLICATION NO. : 11/653107
DATED : August 14, 2012
INVENTOR(S) : Marco Jan-Jaco Wieland et al.

It is certified that error appears in the above-identified patent and that said Letters Patent is hereby corrected as shown below:

In the Claims, Column 14, Claim 1, line 55, please delete "fibers" and insert --said fibers--.

Column 14, Claim 1, line 61, please delete "beam et" and insert --beamlet--.

Column 15, Claim 4, line 14, please delete "abeam" and insert --a beam--.

Signed and Sealed this
First Day of January, 2013

David J. Kappos
*Director of the United States Patent and Trademark Office*